(12) United States Patent
Cornell et al.

(10) Patent No.: US 7,977,398 B2
(45) Date of Patent: Jul. 12, 2011

(54) UV-CURABLE COATINGS AND METHODS FOR APPLYING UV-CURABLE COATINGS USING THERMAL MICRO-FLUID EJECTION HEADS

(76) Inventors: Robert Lee Cornell, Lexington, KY (US); Robert Wilson Cornell, Lexington, KY (US)

( * ) Notice: Subject to any disclaimer, the term of this patent is extended or adjusted under 35 U.S.C. 154(b) by 195 days.

(21) Appl. No.: 12/337,395

(22) Filed: Dec. 17, 2008

(65) Prior Publication Data

US 2010/0152316 A1    Jun. 17, 2010

(51) Int. Cl.
*C09D 11/00* (2006.01)
*C09D 11/10* (2006.01)
*B05D 1/32* (2006.01)

(52) U.S. Cl. ............... 522/75; 522/83; 522/84; 522/79; 427/466

(58) Field of Classification Search ............... 522/75, 522/83, 84, 79; 427/466
See application file for complete search history.

(56) References Cited

U.S. PATENT DOCUMENTS

| | | | | |
|---|---|---|---|---|
| 5,623,001 A * | 4/1997 | Figov | ............. | 522/84 |
| 6,207,728 B1 * | 3/2001 | Sekiguchi et al. | ............. | 522/83 |
| 6,310,115 B1 * | 10/2001 | Vanmaele et al. | ............. | 522/25 |
| 6,608,119 B2 * | 8/2003 | Tanabe et al. | ............. | 522/74 |
| 6,730,714 B2 * | 5/2004 | Ylitalo et al. | ............. | 522/74 |
| 7,479,511 B2 * | 1/2009 | Laksin et al. | ............. | 522/84 |
| 7,591,890 B2 * | 9/2009 | Chang et al. | ............. | 106/31.6 |

\* cited by examiner

*Primary Examiner* — Susan W Berman

(57) ABSTRACT

An aqueous-based UV-curable fluid composition for use in a micro-fluid ejection device. The fluid composition includes a mixture of poly-functional compounds, a colorant compound, a photo-initiator and less than about 50 weight percent water based on a total weight of the fluid composition, wherein the fluid composition is substantially devoid of volatile organic carrier fluids.

13 Claims, 12 Drawing Sheets

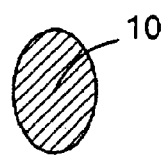 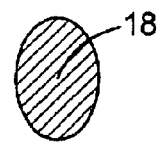
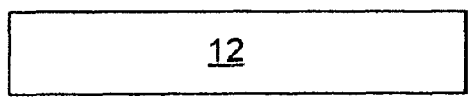 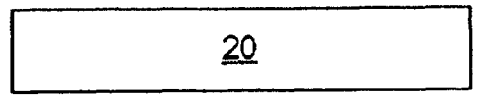
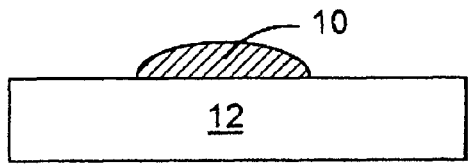 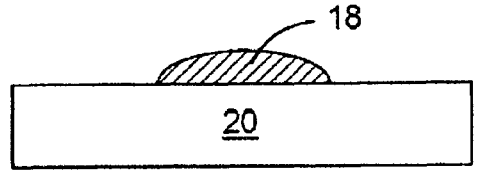
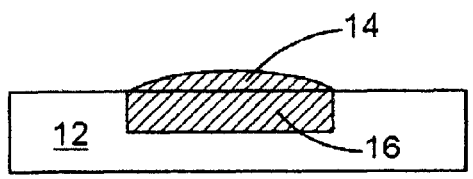 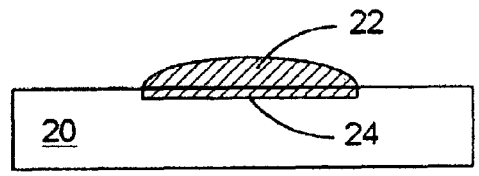
*FIG. 11*    *FIG. 12*

UV-CURABLE COATINGS AND METHODS FOR APPLYING UV-CURABLE COATINGS USING THERMAL MICRO-FLUID EJECTION HEADS

TECHNICAL FIELD

The disclosure relates to ultraviolet (UV) curable coatings and to methods and apparatus for applying UV-curable coatings to substrates. In particular, the UV-curable coatings are coatings that are suitable for application to substrates by use of thermal micro-fluid ejection heads.

BACKGROUND AND SUMMARY

UV-curable coatings were developed many years ago. Many products make use of UV-cured coatings because such coatings are functional (tough, abrasion resistant, stain resistant, water resistant); and attractive (high gloss, endless color selection) and manufacturing friendly (fast curing, inexpensive light source, minimum space requirements). Because of their versatility, UV-curable coatings, in the form of inks, are working their way into the digital printing environment. However, UV-curable coatings and inks come with a unique set of problems that have already been solved for conventional inks and coatings. Until now, UV-curable fluids have typically been used only with piezoelectric ejection heads. Such piezoelectric ejection heads are generally more costly than thermal ejection heads and are typically provided separate from the ink supplies making maintenance of the ejection heads more difficult and costly.

By way of further background, thermal inkjet devices ejecting conventional, i.e., non-UV-curable, inks, typically use inks consisting of 70-80 wt. % water. The remaining mass fraction is typically made up of high boiling point co-solvent/humectants, colorant-dispersants, surfactants and biocides. Conventional inks are formulated for use on paper and other substantially porous or ink absorbing substances. While paper is ubiquitous, there is a significant need for inks that can print on a wider variety of surfaces—in particular non-porous surfaces such as plastic, metal, and glass. It is known that UV-curable inks and coatings are particularly suitable for applying to non-porous surfaces. However, UV-curable inks and coatings are generally solvent based formulations, wherein the solvent is generally selected from ethanol, methanol, 1-propanol, or similar low boiling point liquids.

There are several disadvantages to the use of solvent-based inks and coatings. For one, because of the increased low boiling solvent content in the UV-curable inks and coatings, the ejection kinetics, particularly in the case of thermal micro-fluid ejection devices is significantly lower than aqueous-based inks and coatings. Secondly, solvent based inks and coatings are much more hazardous and pose more danger to the environment than aqueous-based inks and coatings.

Another problem with the use of UV-curable inks and coatings is that the fluids cure when exposed to light. While this is desirable when the fluids are to be cured on a surface, curing of such fluids on the surfaces of the ejection devices or in the ejection nozzles may cause misfiring and other unwanted results. Accordingly, there is a need for UV-curable formulations and micro-fluid ejection devices that provide suitable coating performance in a more environmentally acceptable way. There is also a need for a micro-fluid ejection device that can be operated efficiently to provide high quality images and coatings made from UV-curable fluids.

In view of the foregoing, embodiments of the disclosure provide methods, apparatus, and compositions that are suitable for applying UV-curable fluids via micro-fluid ejection devices. In one embodiment, there is provided a UV-curable fluid composition that is suitable for ejection using a micro-fluid ejection device.

In another embodiment, there is provided a thermal micro-fluid ejection head for ejecting a UV-curable fluid onto a surface. The ejection head includes a nozzle plate having a radiation opaque coating thereon for preventing premature curing of the fluid.

Another embodiment of the disclosure provides a method for operating a thermal micro-fluid ejection head for applying a UV-curable fluid to a substrate.

Yet another embodiment of the disclosure provides a method for coating a surface with a UV-curable fluid to provide a high resolution image on the surface.

Another embodiment of the disclosure provides a page-wide device for applying a UV-curable coating to a substrate.

Still another embodiment of the disclosure provides a scanning micro-fluid ejection head device for applying a UV-curable coating to a substrate.

An advantage of embodiments of the disclosure may be minimal nozzle plate flooding thereby greatly improving droplet ejection directionality and droplet placement on a substrate. Aqueous UV-curable fluids, as described herein, provide a fire frequency that is 40% less than a fire frequency of a conventional aqueous-based ink composition. The fire frequency is lower because the UV-curable fluids generally have higher viscosity than traditional aqueous-based inks thereby reducing the refill rate to fluid ejection chambers. In other words, the micro-fluid ejection system ejecting a UV-curable fluid is more damped than a system operating on a conventional aqueous-based ink. However, despite the lower fire frequency, the UV-curable fluid may actually have no negative impact on throughput of imaged substrates because of minimal flooding, straighter droplet directionality, better droplet placement, and fewer shingling passes needed to provide an image.

BRIEF DESCRIPTION OF THE DRAWINGS

Further advantages of the exemplary embodiments will become apparent by reference to the detailed description when considered in conjunction with the figures, which are not to scale, wherein like reference numbers indicate like elements through the several views, and wherein:

FIG. 11 is a schematic illustration of droplet impact and droplet spreading of an aqueous-based ink composition droplet on a porous substrate;

FIG. 12 is a schematic illustration of droplet impact and droplet spreading of an aqueous-based UV-curable fluid composition droplet on a non-porous substrate;

DETAILED DESCRIPTION OF EXEMPLARY EMBODIMENTS

Figure 1:
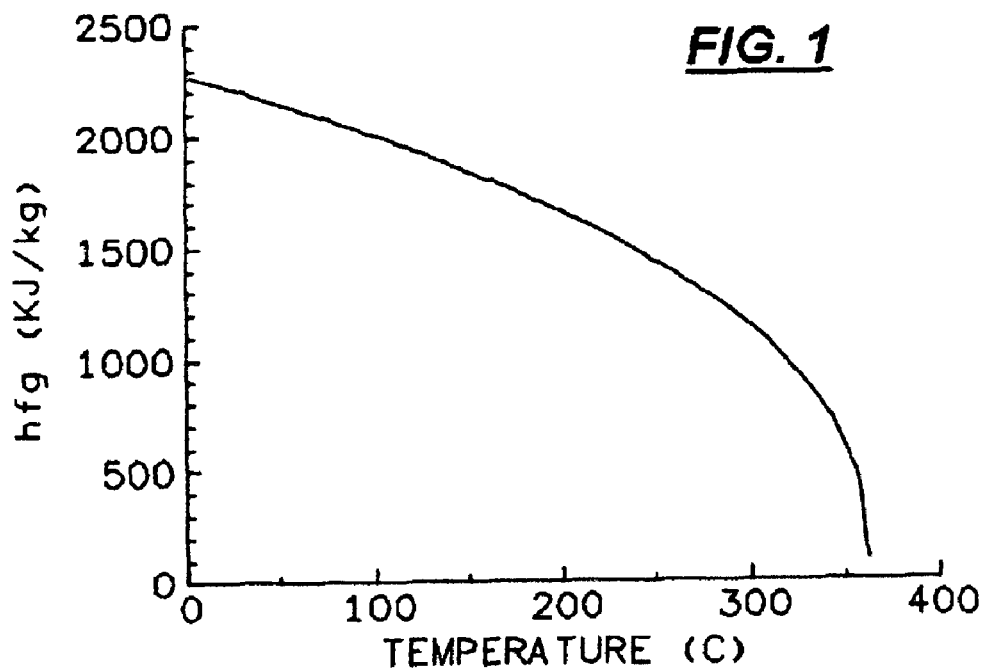
FIG. 1 is a graphical illustration of latent heat of vaporization for an aqueous-based ink composition.

In order to provide a suitable UV-curable fluid for ejection by a micro-fluid ejection device, it is helpful to understand how UV-curable coatings are made and used. After a UV-curable fluid is deposited onto a substrate it is cured using an ultra-violet (UV) light source. Photo-initiators in the UV-curable fluid absorb electromagnetic (EM) energy along discrete UV lines. This EM energy trips a chemical activation energy and causes a reaction between components of the fluid. The reaction is sufficient to convert the liquid into a solid film. Accordingly, the chemical reaction is a fast polymerization process, converting constituent monomers and/or oligomers in the fluid into a cross-linked, structural polymer matrix or into a monomer chain.

Monomers are low molecular weight components of organic molecules that are combined to form oligomers and polymers which contain multiple units of the monomer components. Each unit of the monomer is selected so that it can react with at least two similar molecules, building a polymeric or oligomeric structure. A monomer that can react with two other molecules is said to have a functionality of two. Polymers may contain an unbounded number of monomers units. Oligomers typically consist of a finite number of monomer units and usually have a functionality of greater than two. In general, monomers tend to have lower viscosity than oligomers. Oligomers may form a backbone of the cured polymer or oligomeric structure.

Because there exists a requirement to jet the UV-curable fluid through microscopic ejection ports, it is desirable for the viscosity of the fluid to be in a manageable range. In order to provide a suitable fluid viscosity, relatively low molecular weight monomers may be included in a mixture with a carrier fluid. Monomers tend to reduce the mixture viscosity to an acceptable range for ejecting through the nozzles. A competing requirement to the viscosity of UV-curable fluids is a desire for structural strength in the cured state. Accordingly, there is also a need to include relatively high molecular weight, highly viscous oligomers in the mixture with the monomers and carrier fluid to provide increased structural strength. Because of these competing requirements it is common practice to use a blend of monomers and oligomers in UV-curable fluid formulations so that the components provide compounds having a range of viscosities. For example, the poly-functional compounds may include poly-functional compounds divided into two, three, or more viscosity ranges. In one embodiment, the poly-functional compounds are divided into three viscosity ranges, wherein the viscosity ranges comprise a high range of greater than about 150 centipoise (cps) at 25° C., a medium range from about 40 to about 80 cps at 25° C. and a low range of less than about 4 cps at 25° C.

There is no generally accepted guidelines for an upper limit of monomer units contained in fluid containing an oligomer, but the general rule seems to be in the range of about 10 to about 100 weight percent monomers per weight percent oligomers in the fluid. For the purposes of this disclosure, the monomers and oligomers in the UV-curable fluid will be referred to as "poly-functional" compounds or components. A monomer or oligomer having a functionality of two is referred to herein as a "di-functional" component, and a monomer or oligomer having a functionality of greater than two is referred to herein as a "multi-functional" component.

Because UV-curable inks and coatings are expected to form a solid, cross-linked structure on a substrate when exposed to suitable UV radiation, UV-curable fluids should contain a significant concentration of poly-functional compounds and a sufficient amount of photo-initiator to activate the polymerization process. Typical solvent-based, UV-curable inks and coatings may contain from about 40 to about 60 wt. % poly-functional compounds and less than about 5 wt. % photo-initiator. However, the aqueous-based UV-curable fluids described herein may contain from about 15 to about 30 wt. % poly-functional compound and from about 70 to about 85 wt. % other ingredients, including, but not limited to photo-initiators, water, humectants, surfactants, pigment dispersants, and the like. Of the 70 to 85 wt. % other ingredients, water may comprise a major portion providing from about 40 to about 60 wt. % of the total weight of the aqueous-based UV-curable fluid.

Suitable poly-functional compounds that may be used to make the UV-curable fluids described herein may include oligomers selected from, but are not limited, monoacrylates, diacrylates, triacrylates, polyacrylates, urethane acrylates, polyester acrylates; including mixtures thereof. Suitable oligomer compounds which may be used include, but are not limited to, trimethylolpropane triacrylate, alkoxylated trimethylolpropane triacrylate, such as ethoxylated or propoxylated trimethyolpropane triacrylate, 1,6-hexane diol diacrylate, isobornyl acrylate, aliphatic urethane acrylates, vinyl acrylates, epoxy acrylates, ethoxylated bisphenol-A diacrylates, trifunctional acrylic ester, diethylene glycol diacrylate, unsaturated cyclic diones, polyester diacrylates, and mixtures thereof.

Particularly suitable oligomers may be selected from epoxy acrylates, epoxy diacrylate/monomer blends and aliphatic urethane triacrylate/monomer blends. Other particularly suitable oligomers may be selected from the group consisting of fatty acid modified bisphenol-A acrylates, bisphenol epoxy acrylates blended with trimethylolpropane triacrylate, and aliphatic urethane triacrylates blended with 1,6-hexanediol acrylate.

The monomers that may be use may be selected from trimethylolpropane triacrylate; adhesion promoters such as, but not limited to, 2-phenoxyethyl acrylate, isobornyl acrylate, acrylate ester derivatives, and methacrylate ester derivatives; and cross-linking agents, such as, but not limited to, propoxylated glyceryl triacrylate, polyethyleneimine, polyamines, polyvinyl pyrrolidone, N-methyl-2-pyrrolidone, polyethylene glycol, ethylcellulose, and carboxymethylcellulose. A UV-curable fluid may contain from about 2 to about 10 wt. % oligomeric components and from about 15 to about 25 wt. % monomeric components.

Photo-initiators may be selected from a wide variety of materials, including, but not limited to, benzophenone, trimethylbenzophenone, methyl-benzophenone, 2-hyroxy-2-methyl-1-phenyl-1-propanone, benzyl dimethyl ketal, isopropyl thiooxanthone, 1-hydroxy-cyclohexyl-phenyl-ketone, ethyl 4-(dimethylamino)benzoate, and like compounds. Examples of suitable commercially available initiators include (2-benzyl-2-(dimethylamino)-1-[4-(4-morpholinyl)phenyl]-1-butanone), (2-methyl-1[4-(methylthio)phenyl]-2-morpholinopropan-1-one), (30% 2-benzyl-2-(dimethylamino)-1-[4-(4-morpholinyl)phenyl]-1-butanone and 70% 2,2-dimethoxy-1,2-diphenylethan-1-one), a mixture of 2-isopropylthioxanthone and 4-isopropylthioxanthone), (phosphine oxide, phenyl bis(2,4,6-trimethylbenzoyl)phosphine oxide), a mixture of benzophenone and 1-hydroxycyclohexyl phenyl ketone, and (2-dimethylamino-2-(4-methylbenzyl)-1-(4-morpholin-4-yl-phenyl)-butan-1-o-ne). Other commercially available photo-initiators include a mixture of amine acrylate and acrylic ester and a mixture of trimethylbenzoyldiphenylphosphine oxide, α-hydroxyketones, and benzophenone derivatives, and a mixture of 2,4,6 trimethylbenzophenone and 4 methylbenzophenone.

Photo-initiators are often insoluble, or may have limited solubility in water. However, photo-initiators, as described above, are generally soluble in the poly-functional compounds described herein. Accordingly, it is advantageous to pre-mix the photo-initiator and the poly-functional compounds prior to adding water to the mixture.

In some embodiments, more than one photo-initiator may be used. For example, in some embodiments, different photo-initiators (and/or co-initiators) may be used to cure the fluid. Examples of suitable co-initiators include, but are not limited to, reactive amine co-initiators.

The photo-initiator may be present in UV-curable fluid in any suitable concentration. Examples of suitable concentrations of photoinitiator include, but are not limited to, concentrations in the range of between approximately 0.1 to about 20 weight percent.

Another component of the UV-curable fluid, according to the disclosure, is a co-solvent that acts as a humectant. The co-solvent may have a boiling point of greater than about 200° C. and a viscosity of less than about 13 cps. Suitable co-solvents may include, but are not limited to, diethylene glycol monobutyl ether, 2-pyrrolidone, triethylene glycol monomethyl ether, triethylene glycol monobutyl ether, and hexylcarbitol. The amount of co-solvent in the fluid composition may range from about 12 to about 25 wt. % based on a total weight of the composition.

The colorant for the UV-curable fluid may include any of the conventional pigment or dye-based colorants typically used for printing applications. Suitable pigment based colorants may be selected from a wide variety of commercially available colorants include, but not limited to, carbon black, quinacridone, phthalocyanine, diazo and monoazo pigments, and the like. The pigments may have a mean particle size in the range of about 100 nm with no particles smaller than about 50 nm, or larger than about 150 nm. Suitable dye based colorants may be selected from a wide variety of commercially available, water soluble dyes. The amount of colorant in the fluid may range from about 2 to about 8 wt. % for pigment based colorants and from about 3 to about 6 wt. % for dye based colorants based on a total weight of the composition.

Still another component of the UV-curable fluid is a surfactant. When depositing the fluid on a non-porous surface, as described in more detail below, droplets of the fluid are intended to have a spreading factor that enables a particular spot diameter for the cured droplet. Accordingly, from about 0.5 to about 1.0 wt. % surfactant may be included in the fluid composition based on a total weight of the composition in order to promote droplet spreading on non-porous surfaces. Suitable surfactants may include, but are not limited to, organosilicone surfactants from Momentive Performance Materials, Inc. of Albany, N.Y. under the trade name SILWET.

For comparison purposes, a micro-fluid ejection head having an array suitable for providing fluid ejection droplets as 600 dpi was filled with two different inks. The first in was a conventional aqueous-based pigment ink. The second ink was a UV-curable ink that includes a volatile solvent as a carrier fluid. The solvent for the UV-curable ink candidate contained no water, and was composed of 50 wt. % ethanol, 29 wt. % poly-functional compounds, 3 wt. % photo-initiator, 1 wt. % surfactant, 10 wt. % diethylene glycol monobutyl ether (DEGMBE) humectant and 7 wt. % colorant-dispersant. The UV-curable ink was estimated to have a viscosity of 2.6 mPa-s at 20° C., a surface tension of 0.022 N/m and a density of 0.91. While the UV-curable ink has a very jettable viscosity; ejecting a droplet with a steam bubble is more complicated than just providing a formulation with suitable hydrodynamic and viscous properties. Compared to the aqueous-based pigment ink, the UV-curable ink made with a solvent is estimated to have poor jetting properties.

A typical UV-curable solvent-based ink is given in the following table.

TABLE 1

UV-curable Ink Formulation

| Chemical Components | Molecular Weight (g/mol) | Weight % |
| --- | --- | --- |
| 1,3-Butanediol Diacrylate | 198 | 20.00 |
| 1,6-Hexanediol Diacrylate | 226 | 5.97 |
| Branched $C_8$ Acrylate | ~1000 | 29.85 |
| Methyl Alcohol | 32 | 25.62 |
| 2,2-Dimethoxy-1,2-diphenylethan-1-one | 256 | 3.36 |
| Other | — | 15.2 |

Physical Properties

| pH | Viscosity (cP) | Surface Tension (mN/m) | Naotrac (nm) |
| --- | --- | --- | --- |
| 4.27 | 2.94 | 27 | 490 |

Figure 2:
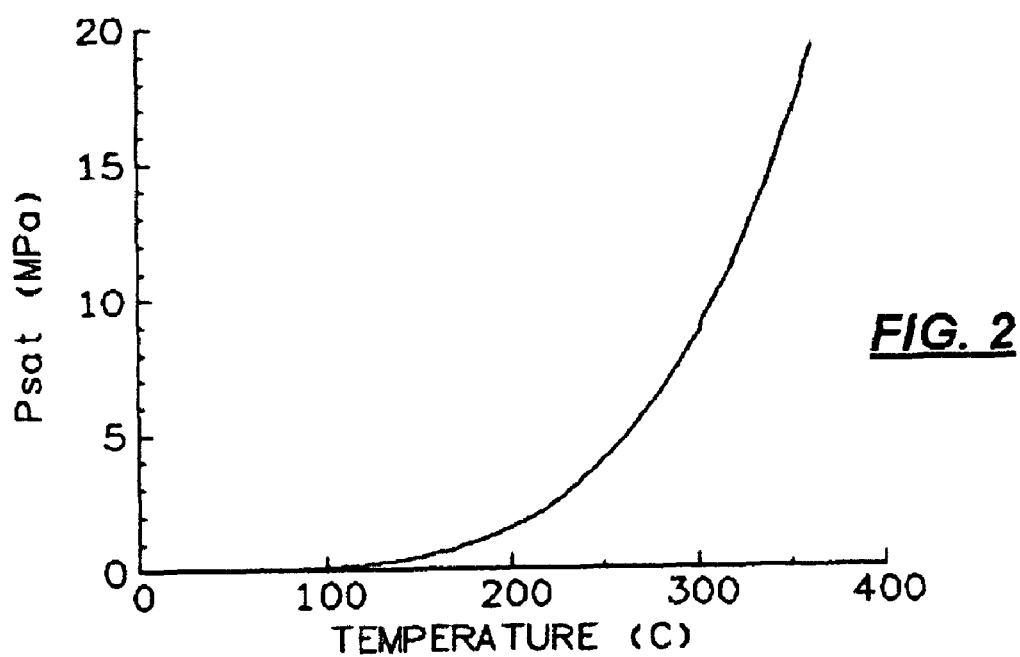
FIG. 2 is a graphical representation of a saturated vapor pressure response for an aqueous-based ink composition.
Figure 3:
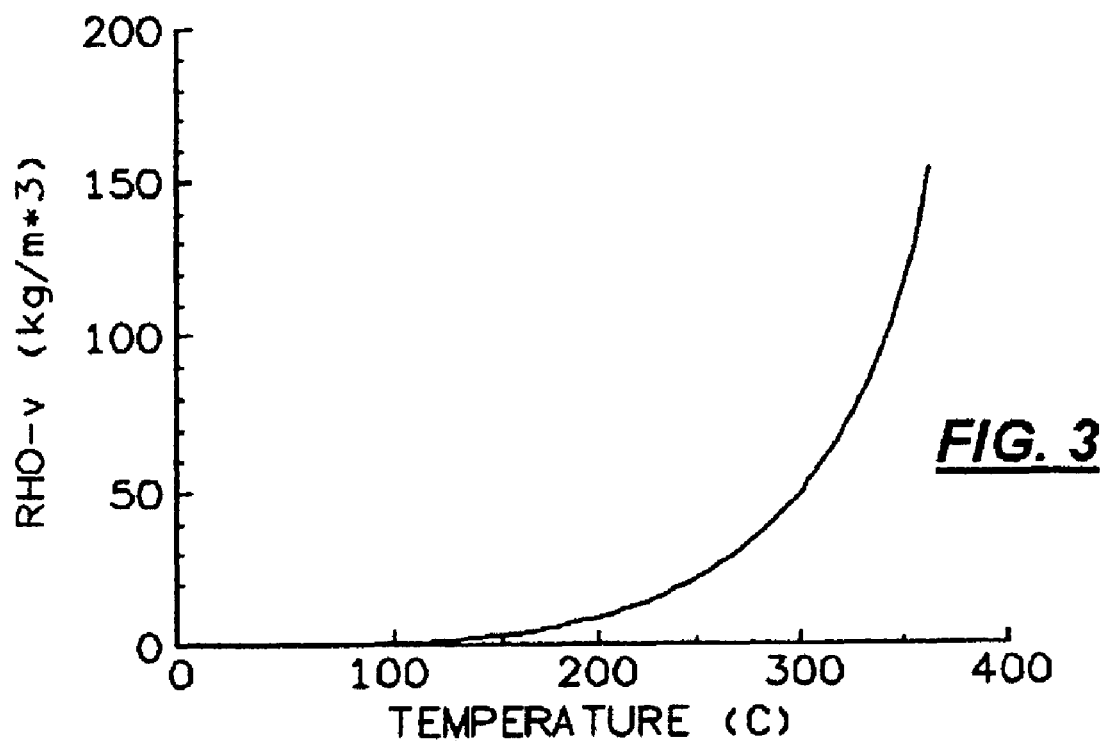
FIG. 3 is a graphical illustration of a saturated vapor density response for an aqueous-based ink composition.
Figure 4:
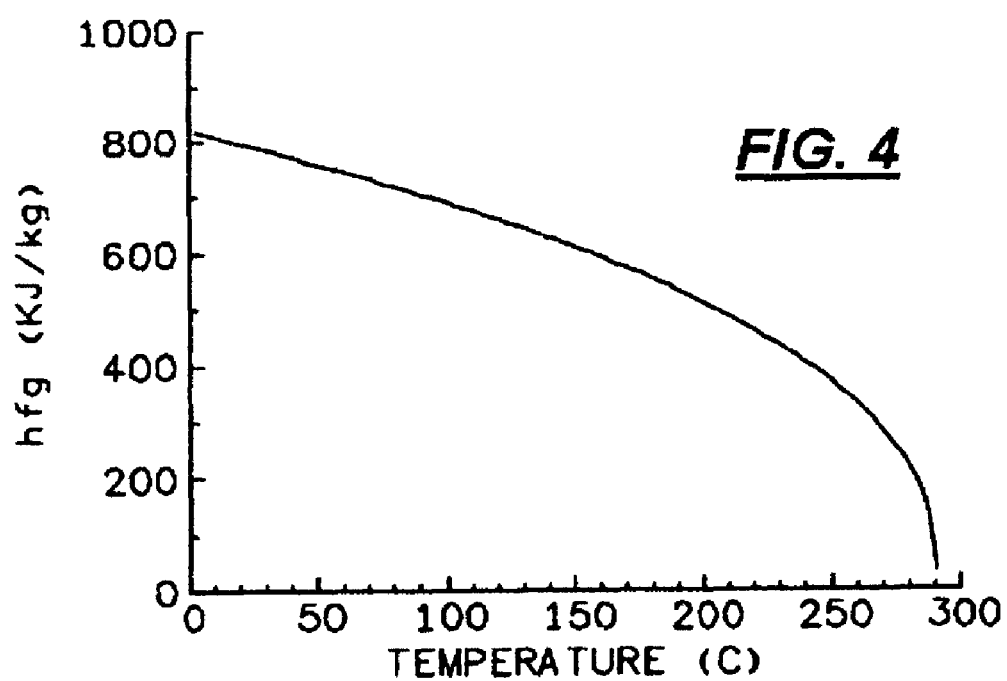
FIG. 4 is a graphical representation of a latent heat of vaporization response for an aqueous-based ink composition.
Figure 5:
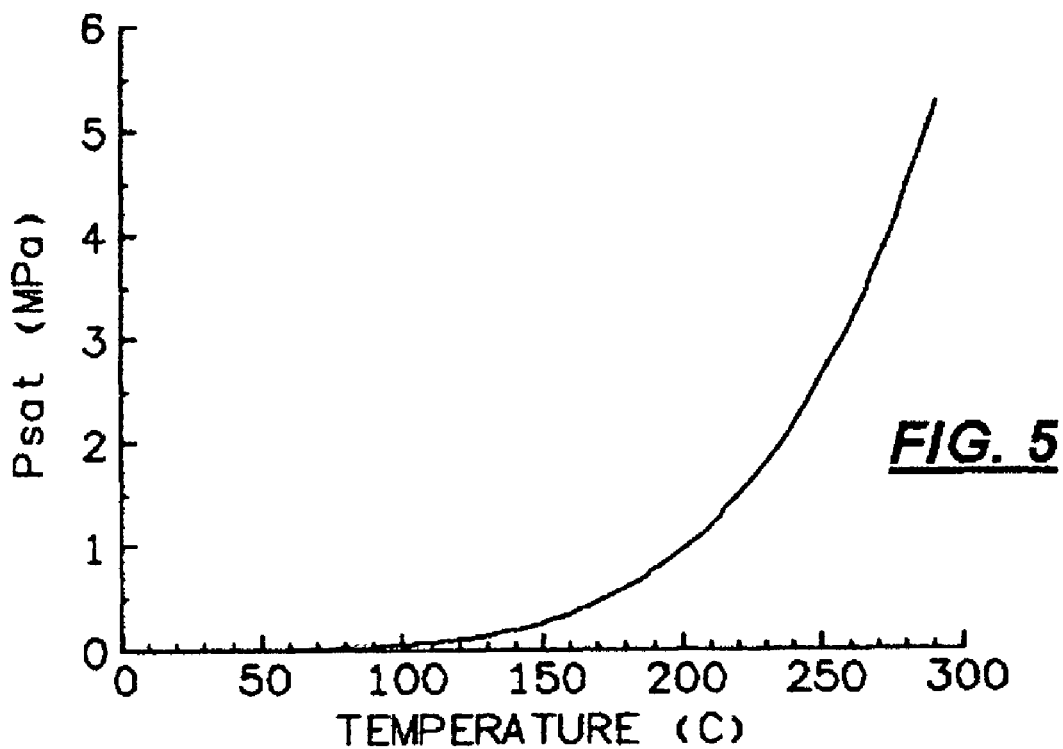
FIG. 5 is a graphical representation of a saturated vapor pressure response for a solvent-based ink composition.
Figure 6:
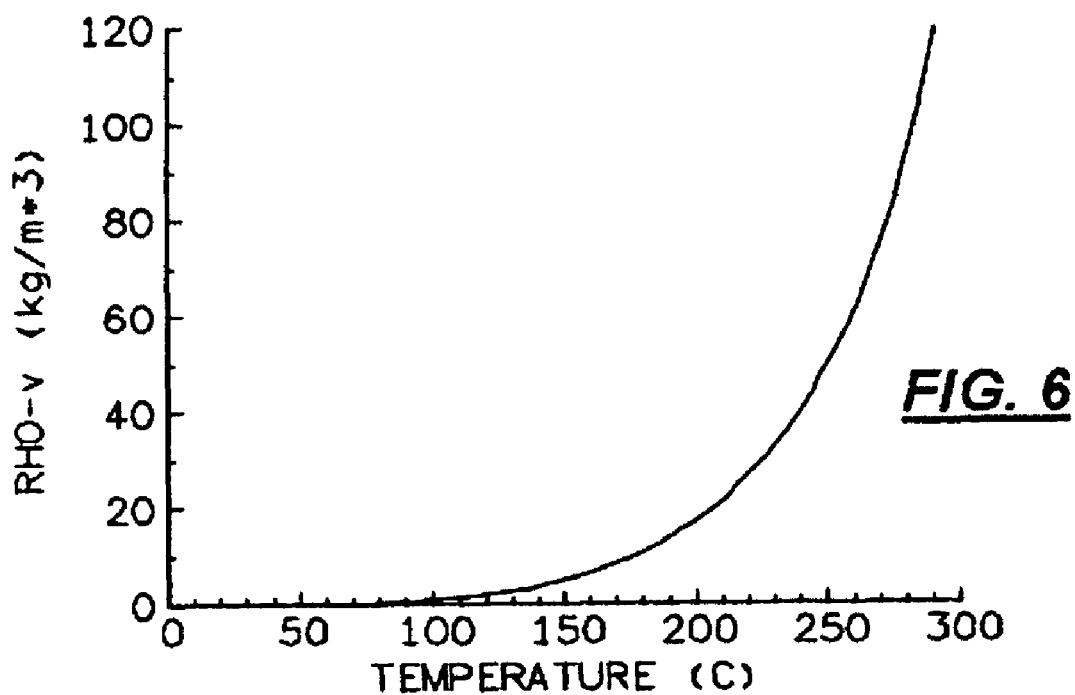
FIG. 6 is a graphical illustration of a saturated vapor density response for a solvent-based ink composition.

Table 2 shows a simulated ejector performance of the micro-fluid ejection head containing the typical aqueous-based pigment ink. A simulated performance of the UV-curable ink, similar to the above UV-curable ink formulation, was made with an ethanol solvent and is also given in Table 2. All of the ejector simulations, ink viscosity and steam properties in the following table were computed with a FEAJET program that is an application specific multi-physics numerical modeling program. The FEAJET program provided estimated values of enthalpy of vaporization versus temperature (FIG. 1), saturated vapor pressure versus temperature (FIG. 2), and saturated vapor density versus temperature (FIG. 3). The same properties are estimated for the solvent-based ink in FIGS. 4-6.

TABLE 2

| Drop Ejection Properties | Water-Based Ink | UV-Curable Solvent-Based Ink |
|---|---|---|
| Displaced nozzle volume (pL) | 33.02 | 1.24 |
| Droplet velocity (in./sec) | 424 | 65 |
| Meniscus attach time (μsec) | 93 | 18 |
| First crossing time (μsec) | 105 | 49 |
| Peak bulge time (μsec) | 124 | 161 |
| Puddle diameter (μm) | 38 | 0 |
| Puddle volume (pL) | 1.18 | 1.33 |
| Puddle height (μm) | 6.96 | 4.2 |
| Heater energy (μJ) | 3.99 | 2.79 |
| Heater resistance (ohm) | 28.4-30.0 | 28.6-30.0 |
| Heater power (mA) | 251-261 | 257-266 |
| Nucleation temperature (° C.) | 306 | 235 |
| Time to nucleation (nsec) | 1225-1383 | 665-890 |
| Maximum heater surface temperature (° C.) | 463 | 402 |
| Initial pressure pulses (atm) | 90.5 | 18.3 |
| Thermal diffusivity of ($\mu m^2/\mu s$) | 0.12 | 0.065 |
| Superheated boundary layer energy (nJ) | 216 | 25 |

The simulated performance of the conventional aqueous-based ink jet ink well-matches the published performance of the ejection head using such an ink. Because the solvent for the UV-curable ink is mostly ethanol (0.78 mol-fraction EtOH) the superheat limit (nucleation temperature) is much lower than for the typical aqueous-based ink. According to the simulations, the aqueous-based ink explodes into vapor at 306° C., while the solvent-based ink explodes into vapor at 235° C. The corresponding initial pressure pulses are 90.5 atm for the aqueous-based ink and just 18.3 atm for the UV-curable ink having a solvent carrier fluid. Accordingly, the pressure pulses for the UV-curable based ink are significantly lower and provide less ejection energy than the aqueous-based ink.

Another thermodynamic disadvantage of UV-curable solvent-based inks compared to conventional aqueous-based inks is that such inks have a much lower thermal diffusivity than aqueous-based inks. The aqueous-based ink of in Table 1 has a thermal diffusivity of 0.12 $\mu m^2/\mu s$; while the thermal diffusivity of the UV-curable solvent-based ink is 0.065 $\mu m^2/\mu s$. This means that the solvent-based ink will absorb far less thermal energy than the aqueous-based ink. Accordingly, the superheated boundary layer of the aqueous-based ink of contains 216 nJ; compared to just 25 nJ for the solvent-based ink. The energy of the superheated boundary layer is the energy stored in the ink's thermal boundary layer prior to nucleation. Such energy is the fuel for the liquid-vapor phase change during bubble growth in the ejection head. Because the pressure pulse of the UV-curable solvent based ink is $\frac{1}{5}^{th}$ of the pressure pulse of water at nucleation and has $\frac{1}{8}^{th}$ of the energy stored in the thermal boundary layer, the ink droplet for solvent-based UV-curable ink has a fraction of the momentum of the aqueous-based ink droplet.

In order to effectively eject the UV-curable solvent-based ink described above, the ejector drive condition should be 10V at 1.4μs. According to the simulations described above, ejection pulses only use only 2.9 μJ of energy for the UV-curable solvent-based ink, while the aqueous-based ink uses 4.0 μJ of energy. Hence, the solvent-base ink droplet is very small and the ejection force is weak. In fact, when considering the pumping effectiveness metric ($\zeta$) that is so important to a temperature rise of the ejection head chip in response to input power, the UV-curable solvent-based inks are less than 1 pL/μJ compared to greater than 5 pL/μJ that is typical of aqueous-based inks.

Because the homogeneous boiling temperature of ethanol is lower than that of water, and the input energy for ejection of ethanol is less than that required for water ejection, the resultant pressure pulse and superheated boundary layer at nucleation for the solvent-based ink is also relatively small. Small, slow jets of fluid droplets are produced when using the UV-curable solvent-based ink, and the ejector is not very efficient as measured by liquid volume-out versus electrical energy-in. Based on the foregoing, the weak jet produced with solvent-based inks should produce un-sharp images having more of an airbrush quality than a well defined, crisp image. The foregoing poor quality was verified by examination of an actual print made with a UV-curable, solvent-based ink ejected from a micro-fluid ejection head that, at best, had an air brush appearance. Accordingly, solvent-based, UV-curable inks and coatings are not only dangerous, environmentally unfriendly products, such ink formulations also produce weak ejection of fluid droplets that form poor, un-sharp images. The weak ejection characteristics for fluids ejected from thermal micro-fluid ejection heads are not mere speculation based upon esoteric simulation results. Actual experimental testing has confirmed the foregoing observations.

Accordingly, there is a fundamental need to find an alternative UV-curable fluid that can provide a robust ejection of fluid droplets when using a thermal micro-fluid ejection head.

In general, UV-curable monomers and oligomers have limited solubility and/or miscibility in water. However, Sartomer Co., Inc., of Exton, Pa. manufactures several poly-functional compounds that have limited water solubility. For example, trimethylolpropane triacrylate (TMPTA), a clear viscous liquid with a functionality of 3 and a viscosity of 225 centipoise (cps) at 25° C. and polyethylene glycol-400 diacrylate (PEG400DA), a clear liquid with a functionality of 2 and a viscosity of 57 cps at 25° C. tolerate about 50 to about 60 wt. % water. In the presence of a photo-initiator and a UV light source, TMPTA and PEG400DA will polymerize. A wide variety of photo-initiators may be used that are soluble in TMPTA.

Accordingly, the following table provides an aqueous-based UV-curable fluid composition that may be used with thermal micro-fluid ejection heads to provide superior ejection performance compared to UV-curable solvent-based fluid formulations.

TABLE 3

| UV-Curable Fluid Component | Wt. % in Fluid |
|---|---|
| trimethylolpropane triacrylate (TMPTA) | 4 |
| diethylene glycol-400 diacrylate (DEG400DA) | 8 |
| N-Methyl-2-Pyrrolidone (NM2P) | 10 |
| diethylene glycol monobutyl ether (DEGMBE) | 20 |
| photo-initiator soluble in TMPTA | 4 |
| pigment, dispersant premix | 5 |
| Surfactant | 1 |
| Water | 48 |

Figure 7:
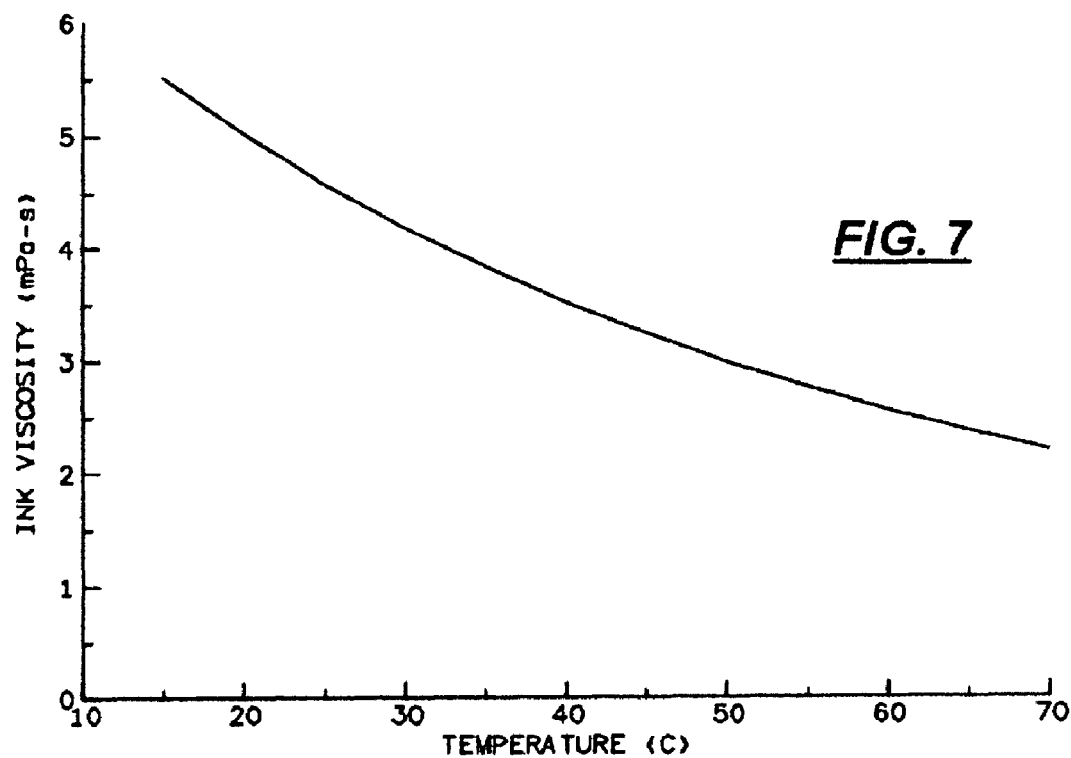
FIG. 7 is a graphical representation of a viscosity-temperature response for an aqueous-based UV-curable fluid composition according to the disclosure.

For the foregoing UV-curable fluid formulation, the expected μ(T) response of viscosity versus temperature is shown in FIG. 7.

Figure 8:
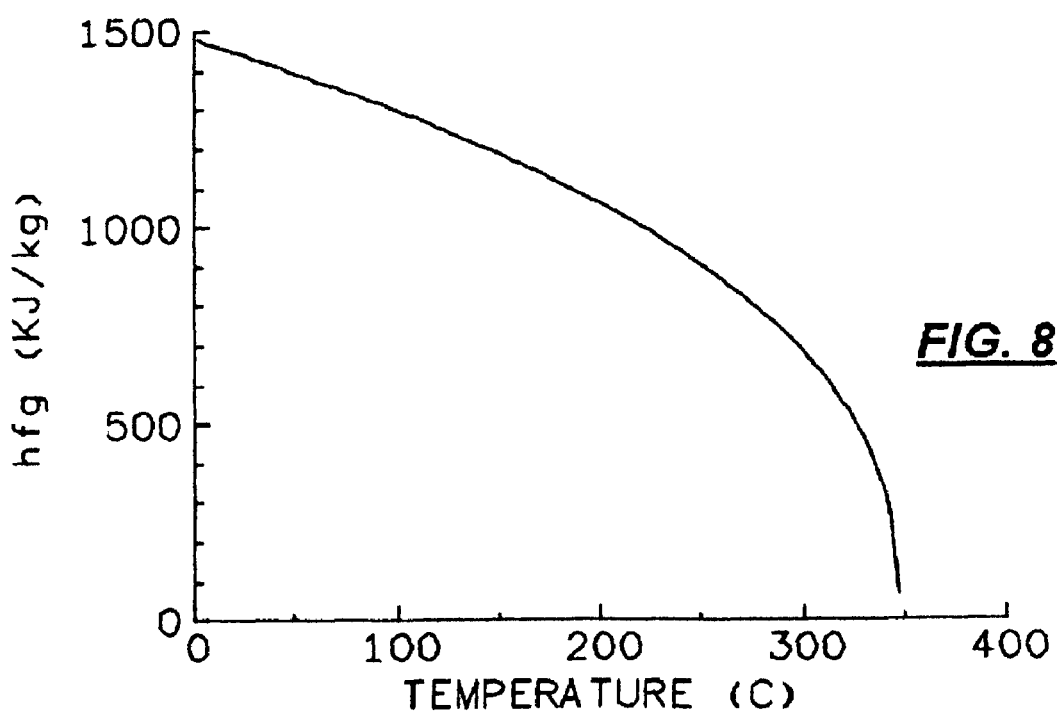
FIG. 8 is a graphical representation of a latent heat of vaporization response for an aqueous-based UV-curable fluid composition according to the disclosure.
Figure 9:
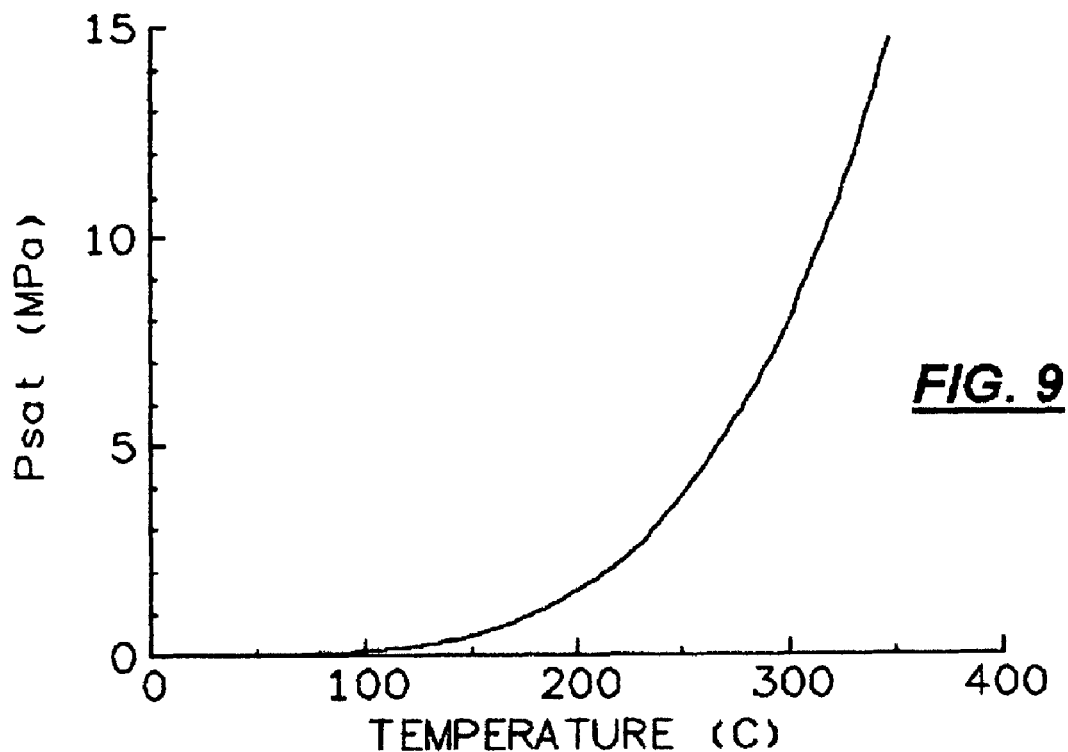
FIG. 9 is a graphical representation of a saturated vapor pressure response for an aqueous-based UV-curable fluid composition according to the disclosure.
Figure 10:
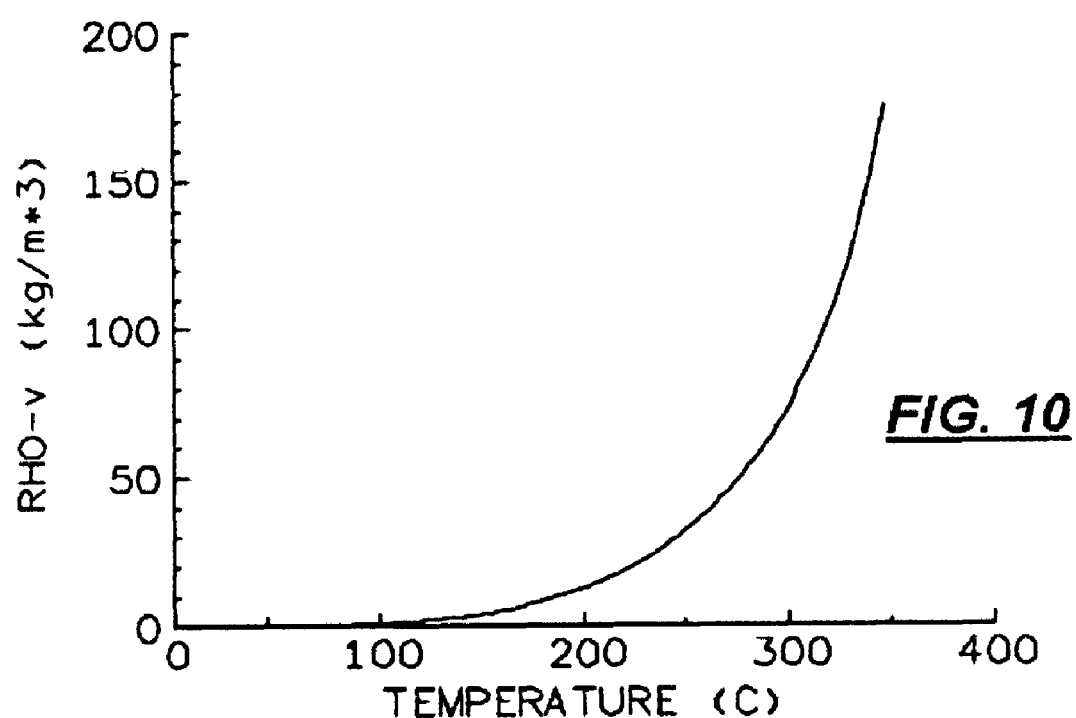
FIG. 10 is a graphical illustration of a saturated vapor density response for an aqueous-based UV-curable fluid composition according to the disclosure.

The saturated steam properties of the aqueous UV-curable fluid formulation of Table 3 are shown in FIGS. 8-10. The properties of the aqueous-based UV-curable fluid are intermediate between the water-based formulation of FIGS. 1-3 and the ethanol-based formula shown in FIGS. 4-6.

The following table provides the expected performance characteristics for a thermal micro-fluid ejection device filled with a conventional aqueous-based mono pigment ink compared to the expected performance characteristics of the same micro-fluid ejection head filled with the aqueous-based UV-curable fluid according to Table 3.

TABLE 4

| Drop Ejection Properties | Conventional Aqueous-Based Ink | UV-Curable Aqueous-Based Fluid |
|---|---|---|
| Displaced nozzle volume (pL) | 23.39 | 16.51 |
| Droplet velocity (in./sec) | 394 | 324 |
| Meniscus attach time (μsec) | 97 | 166 |
| First crossing time (μsec) | 110 | 222 |
| Peak bulge time (μsec) | 125 | 351 |
| Puddle diameter (μm) | 30 | 0 |
| Puddle volume (pL) | 2.22 | 0.09 |
| Puddle height (μm) | 6.12 | 0.34 |
| Heater energy (μJ) | 3.32 | 3.32 |
| Heater resistance (ohm) | 28.8-30.7 | 28.7-30.7 |
| Heater power (mA) | 285-300 | 285-300 |
| Nucleation temperature (° C.) | 314 | 292 |
| Time to nucleation (nsec) | 2440-2555 | 2378-2498 |
| Maximum heater surface temperature (° C.) | 529 | 549 |
| Initial pressure pulses (atm) | 94.2 | 67.9 |
| Thermal diffusivity (μm$^2$/μs) | 0.12 | 0.12 |
| Superheated boundary layer energy (nJ) | 216 | 101 |

Because the aqueous UV-curable fluid formulation has a lower superheat limit than the conventional aqueous-based pigment formulation, the UV-curable fluid also has a lower pressure impulse (5925 atm-ns versus 6728 atm-ns for the pigment ink formulation), and because the UV-curable fluid formulation has a higher viscosity (3.24 mPa-s at 45° C. versus 1.42 mPa-s at 45° C. for the aqueous-based pigment formulation)—the UV-curable formulation produces a smaller droplet (16.5 pL versus 23.4 pL for the pigment-based formulation). The simulations show that higher viscosity affects refill time in a negative fashion. Accordingly, the aqueous-based pigment ink formulation droplet of 23.5 pL refills at a rate consistent with 10-11 KHz operation. Whereas the aqueous UV-curable formulation is limited to a refill rate that is consistent with about 6 KHz operation, even with a smaller, 16.5 pL droplet size.

The benefit to a formulation having a higher viscosity is seen by comparing puddle volume at meniscus bulge. Minimizing the size of the meniscus bulge will minimize nozzle flooding. The aqueous UV-curable fluid formulation has about 25 times less ink in the meniscus bulge (puddle volume 0.09 pL for the UV-curable fluid versus 2.22 pL puddle volume for the aqueous-based pigment formulation).

Another difference between the pigment-based formulation and the aqueous-based UV-curable fluid formulation relates to how the fluid interacts with the surfaces upon which they are ejected. As shown in FIG. 11, aqueous-based ink formulations provide droplets 10 that depend on absorption and evaporation of the solvent to form a pixel 14 on a porous substrate 12 wherein a portion 16 of the droplet 10 is absorbed into the substrate 12. On the other hand, UV-curable fluids provide droplets 18 that polymerize on a surface of a non-porous substrate 20, and there is much less solvent to evaporate as shown in FIG. 12. The resulting pixel 22 is formed by curing the droplet 18 on the substrate 20 with minimum penetration 24 into the substrate. Thus it is expected that aqueous-based UV-curable fluids may require less droplet volume per pixel than traditional water-based, porous-substrate applications.

In order to determine a suitable ejection volume of aqueous-based UV-curable fluids, a spread factor for the droplets is defined as D*/d, where D* is the spot diameter formed by the fluid droplet on the substrate, and d is the diameter of the droplet prior to impact. Conventional pigment-based inks have three stages that determine the spread factor D*/d. The stages include a dynamic droplet spreading stage followed by penetration into the substrate and evaporation of the water into the surrounding air. There are a plethora of articles that attempt to reduce this seemingly-simple problem to a set of equations. In all cases, the "neat" equations require insertion of empirical data. However, the insertion of empirical data is unsatisfactory to use in the case of an aqueous-base UV-curable formulation because the solutions are strongly dependent upon empirical fudge factors that, in turn, are strongly dependent upon the substrate(s) and ink(s) of interest. There is no mathematically elegant solution to providing a calculation of the spread factor, D*/d, for an aqueous-based UV-curable formulation. Hence, regression analysis was performed on experimental data to quantify D*/d. For example, typical aqueous pigment-inks, when printed on plain paper are well-represented by the following regression equation derived from experimental data:

$$D_F \approx 18.8(m)^{0.41}$$

wherein $D_F$ is a final spot size on paper after dynamic spread, capillary spreading and solvent evaporation. Typical pigment-based inks have a density of approximately 1000 kg/m$^3$, so 1 picoliter of liquid equates to 1 nanogram of liquid.

The above regression equation implies that the 23.4 pL droplet should produce a spot size of approximately 68 microns on plain paper. The diagonal of a 600 dpi pixel equals 60 microns, so the pixel is completely saturated with achromatic color, as intended, when hit with the ink formulation and droplet size of 23.4 pL.

However, a new set of rules may need to be considered for a UV-curable fluid printing application. UV-curable fluids are generally used on media surfaces that are non-porous and the aqueous UV-curable fluids tend to have much less water initially, so previous spread factors based upon capillary wicking and evaporation are meaningless. Thus, without extensive experimentation—tweaking of ejector hardware, chip, flow feature, ink formulation, drive conditions, cure conditions, etc., it is difficult to provide an empirical regression equation to test the adequacy of the 16.5 pL aqueous UV-curable fluid droplet to provide suitable pixels for image formation.

When a traditional water-based ink droplet hits the paper, solvent (i.e. water) evaporation and capillary wicking must be considered. The solvent does not form a polymer structure on the substrate, and it must be driven off by evaporation and/or capillary penetration into the media. UV-curable fluids greatly differ from the mechanisms present for aqueous-based pigment inks. First of all, UV-curable fluids have much less solvent (water) to consider because a significant portion of the formulation consists of poly-functional components intended to form a cross-linked structure on the substrate surface. Secondly, typical substrates of interest for UV printing have limited (or none) capillary penetration (a primary reason for the existence of the UV-curable fluid market segment). Accordingly, for UV-curable fluids—the dynamic droplet spreading effect dominates, and the evaporation-penetration effects may be ignored as second order variables. Considering only the dynamic spreading effect of UV-curable fluid droplets greatly simplifies the problem.

It has been found that the dynamic droplet spread factor of a UV-curable fluid droplet (D*/d) is a function of the Weber number (We) and the Reynolds number (Re) and is independent of media or substrate type. Since (We) is a function of surface tension, and (Re) is a function of viscosity, fluid variability may be accounted for. Accordingly, an equation for dynamic spread factor of a UV-curable fluid on a non-porous substrates is as follows:

$$D*/d = 1 + 0.48 We^{0.5} \exp(-1.48 We^{0.22} Re^{0.21})$$

The foregoing equation may be converted into a form where the independent variables are directly evident-making their effects more visible. As a first step, it may be recognized that the $We^{0.22}$ and $Re^{-0.21}$ terms may be written as $(We/Re)^k$ with no real loss in accuracy because k is between 0.21 and 0.22. After canceling terms, (We/Re) may be reduced to (uμ/σ). Thus the We and Re terms are simply reduced to droplet velocity multiplied by the ratio of viscosity to surface tension. With respect to the term $We^{0.5}$, the Ohnesorge number (Oh) relates surface tension and viscous forces and is a function of We and Re. The Ohnesorge (Oh) number is encountered in fluid mechanics when dealing with droplets and jets. An equation for the Ohnesorge number is as follows:

$$Oh = We^{0.5}/Re$$

Hence the $We^{0.5}$ can be replace with Oh*Re in the spread factor equation providing the following equation:

$$D*/d = 1 + 0.48u(\rho d/\sigma)^{0.5} \exp(-1.48(u\mu/\sigma)^k)$$

wherein D* is the diameter of the droplet after impact with the substrate, d is the droplet diameter which is approximately equal to $(6V/\pi)^{1/3}$, V is the droplet volume, u is the droplet impact velocity, ρ is the droplet density, μ is the droplet viscosity, σ is the droplet surface tension, k is greater than or equal to 0.21 and less than or equal to 0.22. From the foregoing equation, the spread factor is 1.9 and the droplet diameter is D* is 60 microns.

Hence, it is reasonable to assume that the aqueous UV-curable fluid formulation given above will produce a 60 micron diameter spot size when the fluid is ejected from a micro-fluid ejection head onto a non-porous substrate. As set forth above, the length of the diagonal of a 600 dpi pixel is 60 microns. Accordingly, an image printed with a UV-curable fluid on a non-porous substrate may be printed with significantly less fluid, while providing relatively high resolution image than an image printed with an aqueous base conventional ink on a porous substrate.

Other advantages of using an aqueous-based UV-curable fluid as described herein are numerous. For example, in page wide inkjet printing devices using conventional aqueous inks, issues arise with regard to the capability to deposit large amounts of ink in a relatively short time period, as well as the short time period for evaporation to occur before subsequent pages are ejected onto the prior page in the exit tray. Slow evaporation may cause page-to-page offset, which is generally referred to as "water management" issues. However, the above described UV-curable fluid formulation contains about 30 wt % less water than a conventional aqueous-based pigment ink and the cured UV fluid forms polymerized solids thereby alleviating "water management" issues associated with the use of aqueous-based pigment inks.

As desirable as it may sound, a page wide printer presents other issues that have to be resolved. For example, cross-linking or curing of a UV curable fluid may occur as a result of scattered UV light at the meniscus/air interface. Cured or partially cured UV fluid at the meniscus/air interface may cause significant maintenance problems, if not a fatal mechanism for failure of an ejection head, due to curing of excess fluid on the surface of the ejection head. In order to prevent scattered UV light from interacting with the UV-curable fluid in the meniscus/air interface, a UV light shielding device may be provided.

Figure 13:
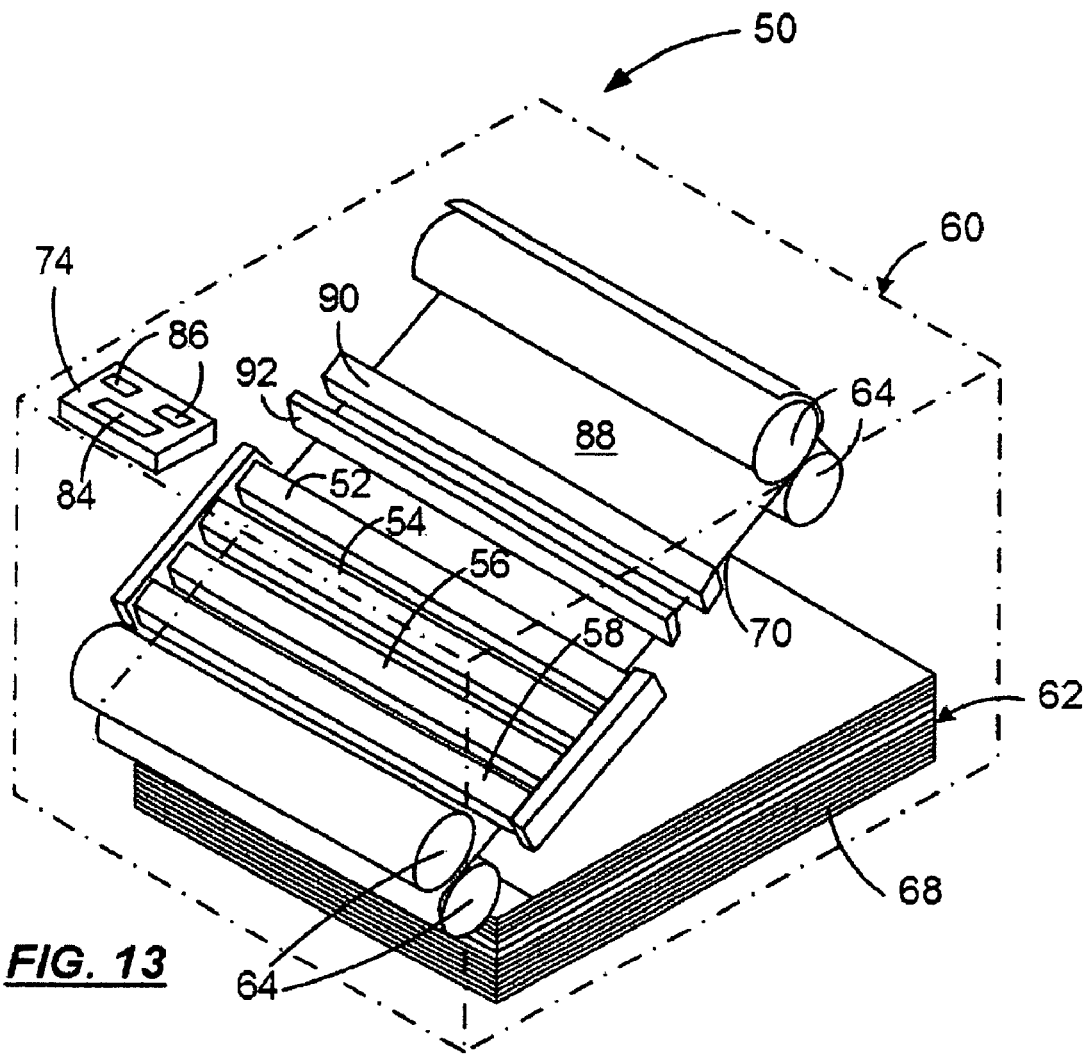
FIG. 13 is a perspective view, not to scale, a page wide printing device for depositing a UV-curable fluid on a substrate according to one embodiment of the disclosure.

FIG. 13 provides an illustration of a page-wide printing device 50. The printing device 50 includes a plurality of elongate ejection heads for providing different color inks therefrom. For example, there may be an ejection head 52 for black ink, an ejection head 54 for cyan ink an ejection head 56 for magenta ink, an ejection head 58 for yellow ink. The printing device 50 includes a housing 60 having a paper tray 62, platens 64 and other well known apparatus (not shown) for moving paper or other printable substrates through the printing device 50. For example, continuous or individual sheets 68 of non-porous material to be printed upon are moved along a sheet path 70 by any of a number of well known sheet handling techniques past the ejection heads 52-58 for printing thereon.

Figure 14:
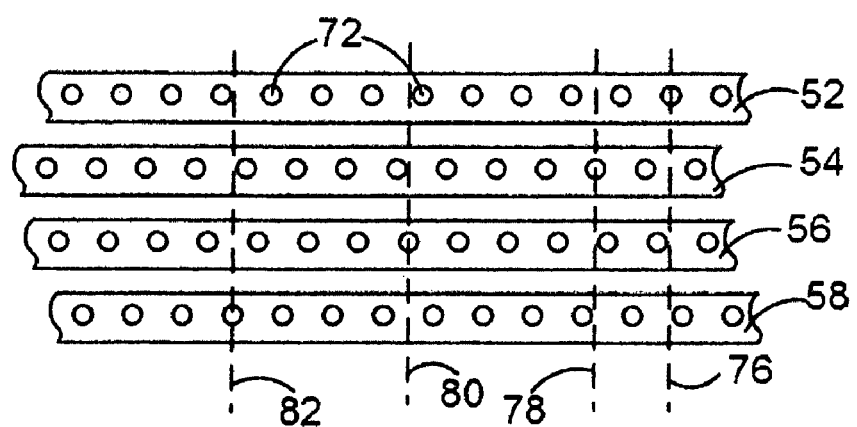
FIG. 14 is a plan view, not to scale, of ejection heads for the page-wide printing device of FIG. 13.

The page wide ejection heads 52-58 are mounted within the housing 60 adjacent a portion of the sheet path 70 for depositing fluid drops on sheets of material moving along the sheet path 70. Each of the ejection heads 52-58 have a plurality of ejection nozzles 72, FIG. 14. The number of nozzles 72 in each of the ejection heads 52-58 may exceed the number of nozzles 72 required to print across the entirety of a sheet of material having the widest width accommodated by the printing device 50. For example, in a 300 dots-per-inch (dpi) printing device 50, for a page wide ejection head to print upon eight inches of a sheet of material, 2400 nozzles 72 are required. Accordingly, if the printing device 50 is to print an eight inch width on sheets of material passing through the printing device 50, each of the ejection heads 52-58 has more than 2400 nozzles 72. It is noted, however, that while the ejection heads 52-58 have more nozzles 72 than required, each of the ejection heads 52-58 need not have the same number of nozzles 72.

A controller 74 selects which of the ejection nozzles 72 are used for operation of the printing device 50 with the selected nozzles 72 depending upon the mounting of the ejection heads 52-58 within the printing device 50. The ejection heads 52-58 may be installed individually in the printing device 50 so that the nozzles 72 on each of the ejection heads 52-58 are not in alignment with one another as shown by lines 76-82. For example, only a nozzle on ejection head 52 falls on line 76, only a nozzle on ejection head 54 falls on line 78, only a nozzle on ejection head 56 falls on line 80 and only a nozzle on ejection head 58 falls on line 82. The spacing between adjacent nozzles 72 and an offset from lines 76-82 of nozzles 72 on adjacent ejection heads 52-58 on an ejection head may be used to determine the print resolution in terms of dots per inch (dpi).

The controller 74 then applies the offsets to identify ones of the nozzles 72 in the ejection heads 52-58 which are used for printing. The controller 74 may also be used to determine a range of nozzles which are mapped so that the appropriate ones of the nozzles are used for printing. The controller 74 includes a memory unit into which the nozzle offsets are loaded for operation of the printing device 50. The controller 74 may include nonvolatile random access memory 84 or switches 86 that may be manually set to define the nozzles to be used.

After printing an image on the substrate 88, an actinic radiation source 90 is used to cure the printed image. The actinic radiation source 90 may be an ultraviolet (UV) or other light source having a wavelength that is effective to activate the initiator in the printed fluid and cause cross-linking of the poly-functional components in the fluid.

In order to prevent curing of the fluid on nozzle plates for the ejection heads 52-58, an actinic radiation shielding device 92 is used to prevent actinic radiation from the radiation source 90 from activating the initiators in the fluid in or on the nozzle plates of the ejection heads 52-28. The shielding device 92 may include a material opaque to UV radiation such as a material selected from ceramic, stainless steel, and certain UV opaque polymers, or the shielding device 92 may be a substantially rigid material coated with ceramic as discussed described below, in non-contact, close proximity to the imaged substrate 88.

Additional shielding devices may be used to prevent ambient light from prematurely curing the UV-curable fluid. Such shielding devices may include, but are not limited to, light resistant enclosures for the ejection heads, actinic radiation source, substrate supply, controls and the like.

Figure 15:
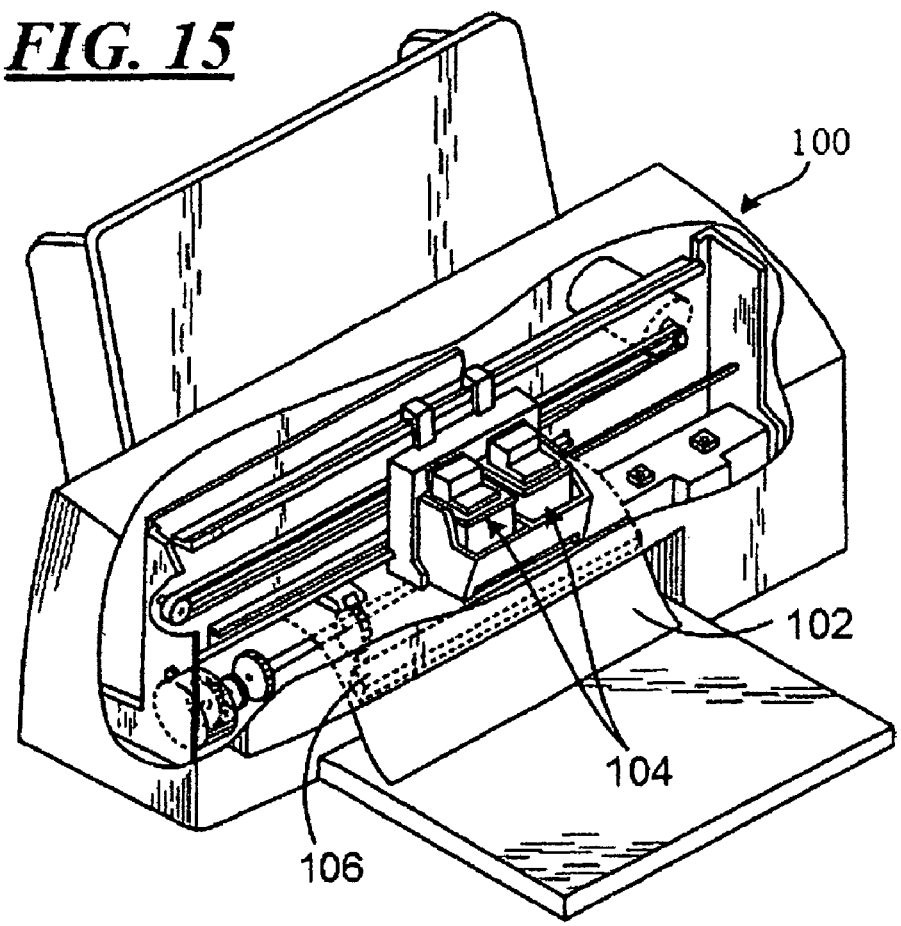
FIG. 15 is a perspective view, not to scale, a scanning printing device for depositing a UV-curable fluid on a substrate according to another embodiment of the disclosure.
Figure 16:
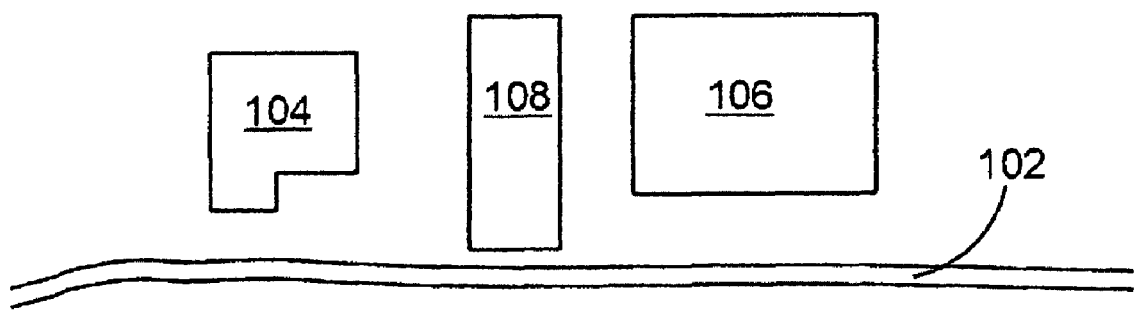
FIG. 16 is a schematic illustration of components of a scanning printing device for depositing a UV-curable fluid on a substrate, wherein the printing device has a stationary actinic radiation source and a stationary radiation shielding device according to an embodiment of the disclosure.

A scanning printing device 100, such as illustrated in FIG. 15 may also be used for applying the aqueous-based UV-curable fluid to a substrate. Such a device may include a conventional printer that is adapted to apply the UV-curable fluid to a substrate 102 from one or more fluid cartridges 104, and to cure the fluid once it is applied to the substrate. Accordingly, an actinic radiation source 106 may be included as a stationary source with a suitable stationary radiation shielding device 108, between the radiation source 106 and the fluid cartridges 104. The shielding device 108 is in close proximity to the substrate 102 as described above and as shown schematically in FIG. 16.

Figure 17:
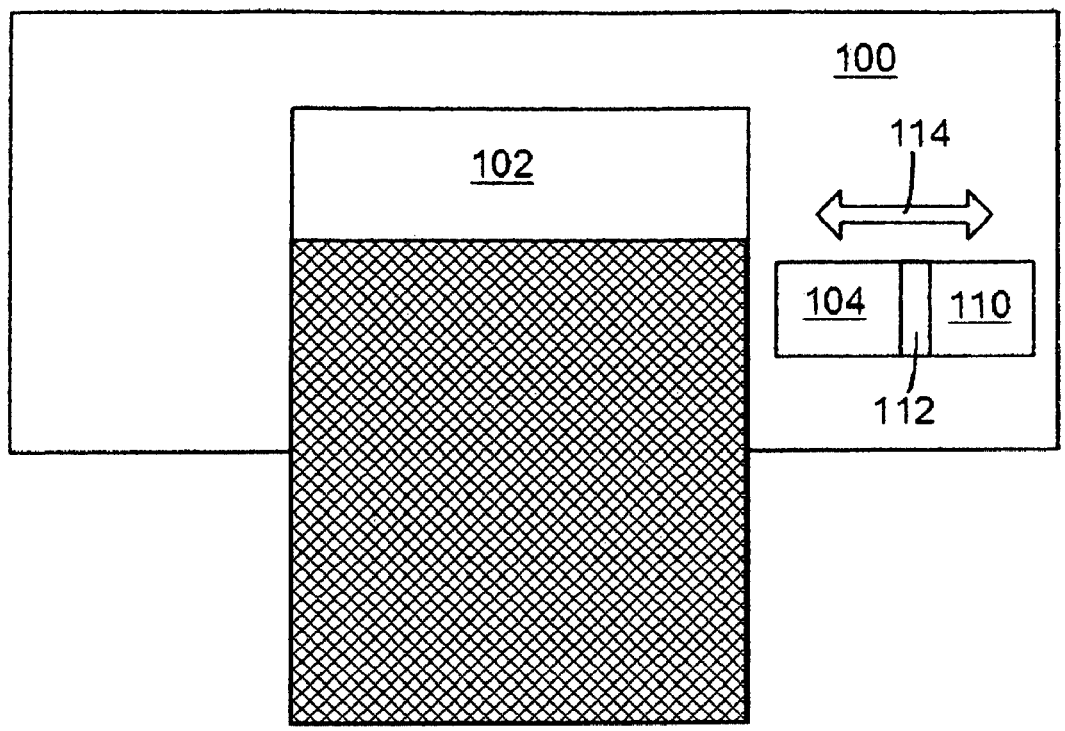
FIG. 17 is a schematic illustration of a scanning printing device for depositing a UV-curable fluid on a substrate, wherein the printing device has a scanning actinic radiation source and a radiation shield disposed between the radiation source and a fluid cartridge.

In an alternative, a scanning actinic radiation source 110 and shielding device 112 may be included adjacent to a scanning fluid cartridge 104 as shown schematically in FIG. 17. In this embodiment, all of the cartridge 104, actinic radiation source 110 and shielding device 112 scan across the substrate 102 as indicated by arrow 114. As with the page wide printing device 50, it is important to adequately shield the ejection head from the actinic radiation source 106 or 110 and ambient light so that premature curing of the UV-curable fluid does not occur.

Figure 18:
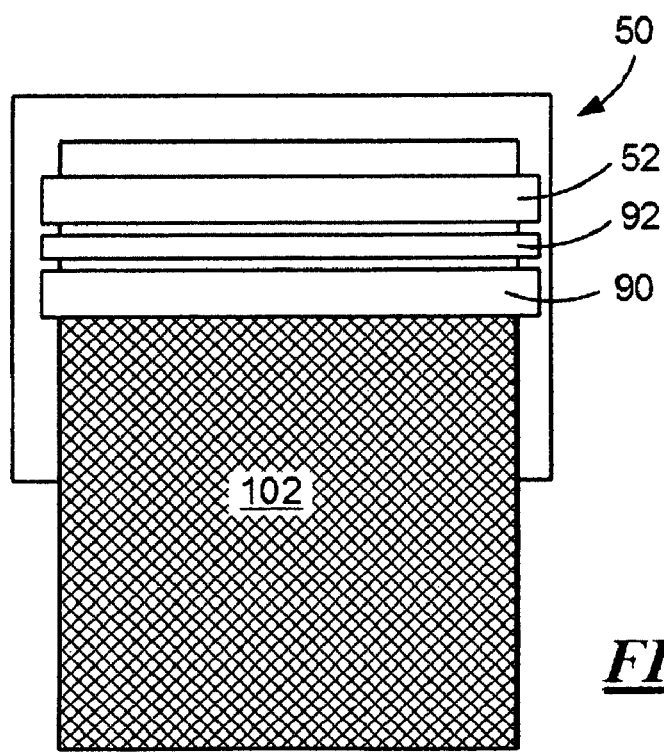
FIGS. 18-22 are cross-sectional views, not to scale, of a portion of a micro-fluid ejection head during a process for making a micro-fluid ejection head for ejecting a UV-curable fluid according to the disclosure.

The printing device arranged with the fluid cartridge 104, actinic radiation source 110, and UV shielding device 112 in a scanning or serial embodiment as shown in FIG. 17 may substantially increase a minimum interior width of the printing device 100. For many applications, such as a home or office printing environment, an increased width is not particularly desirable. Accordingly, it may be more advantageous to page-wide printing device 50 with the UV shield 92 between the ejection head 52 and the actinic radiation source 90, as shown in FIG. 13, as this arrangement may provide an optimum minimum interior width, allowing for an overall smaller printing system footprint as illustrated by the schematic drawing of the printing device 50 in FIG. 18.

In a less desirable alternative to the above printing devices that include an actinic radiation source, the printing devices may be configured so that the printed surface of the substrate is exposed to ambient light that is sufficient to cure the fluid. In this case, there may have to be a delay between printing a first printed surface and printing of a subsequent surface to allow sufficient time for the UV-curable fluid images to cure on the first printed surface.

Ejection heads for the page wide printing device 50 and the scanning printing device 100 may be made using photoimageable polymeric materials to provide flow features and nozzle plates for the ejection heads. By way of example, a schematic drawing of the flow features of an ejection head 200 is illustrated in FIG. 19.

The ejection head 200 has a flow feature area that includes a fluid flow channel 202 and a fluid ejection chamber 204 provided by a thick film layer 206 that may also be made of a photoimageable polymeric material. The thick film layer 206 may be provided by a positive or negative photoresist material applied to a device surface 208 of a wafer or substrate 210 containing the fluid ejection actuators 212 and drivers therefor, as a wet layer by a spin coating process, a spray coating process, or the like. In the alternative the thick film layer 206 may be applied to the wafer as a dry film photoresist material using heat and pressure. Examples of suitable photoresist materials, include, but are not limited to, acrylic and epoxy-based photoresists such as the photoresist materials available from Shell Chemical Company of Houston, Tex. under the trade name EPON SU8 and photoresist materials available from Olin Hunt Specialty Products, Inc. which is a subsidiary of the Olin Corporation of West Paterson, N.J. under the trade name WAYCOAT. Other suitable photoresist materials include the photoresist materials available from Clariant Corporation of Somerville, N.J. under the trade names AZ4620 and AZ1512. A particularly suitable photoresist material includes from about 10 to about 20 percent by weight difunctional epoxy compound, less than about 4.5 percent by weight multifunctional crosslinking epoxy compound, from about 1 to about 10 percent by weight photoinitiator capable of generating a cation, and from about 20 to about 90 percent by weight non-photoreactive solvent as described in U.S. Pat. No. 5,907,333 to Patil et al., the disclosure of which is incorporated by reference herein as if fully set forth.

After coating the thick film layer 206 onto device surface 208 of the substrates 210, the flow features may then be formed in the thick film layer 206 using conventional photo-imaging techniques. A mask may be used to define the flow features in the thick film layer 206 during the imaging process. The imaged thick film layer 206 may be developed using standard photolithographic developing techniques.

Figure 19:
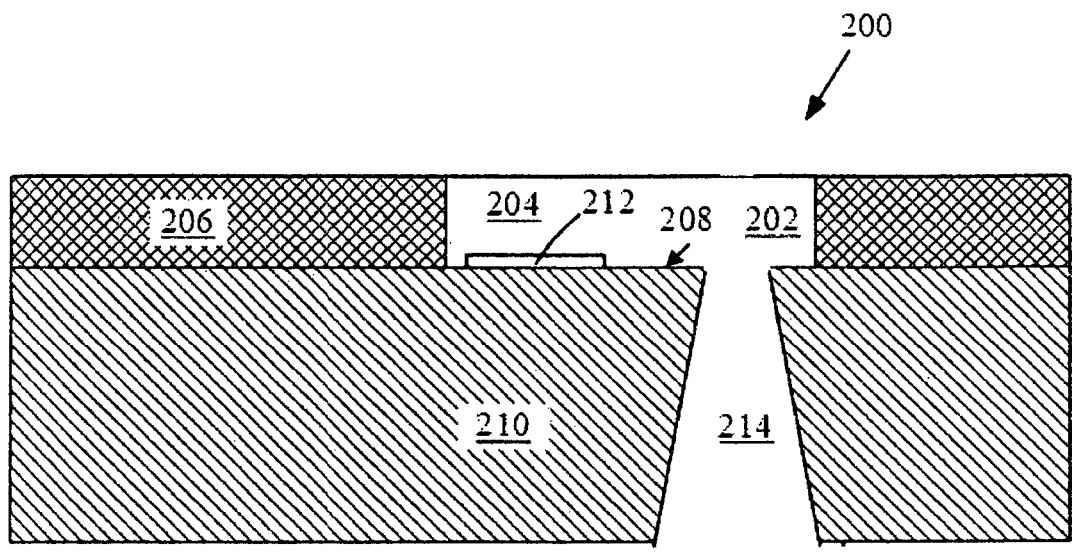
Figure 20:
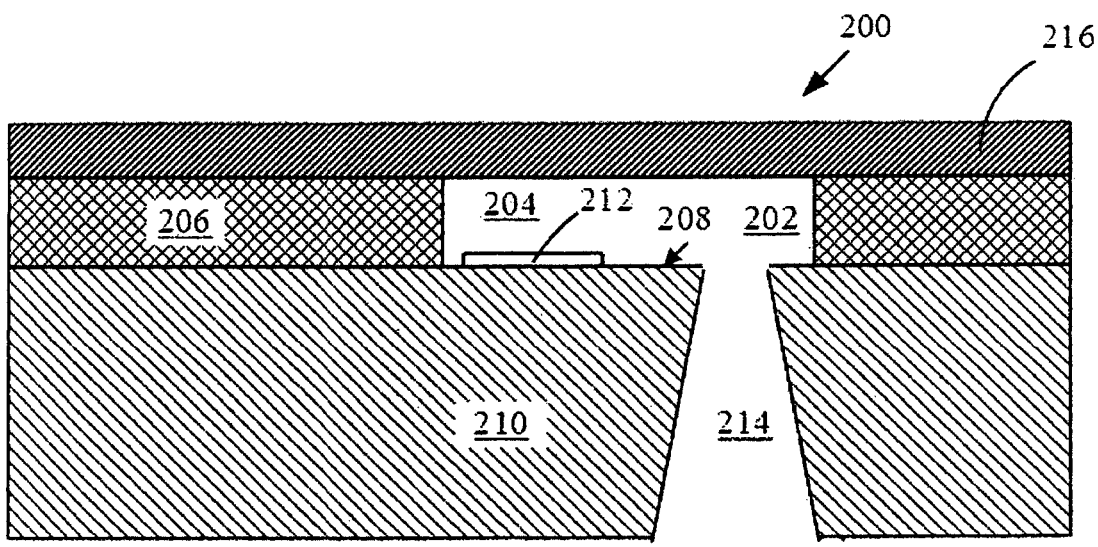

Before or after applying the thick film layer 206 to the wafer containing the substrates 210 and before or after imaging and developing the thick film layer 206, one or more fluid supply slots 214 may be formed through the substrates 210 as shown in FIG. 19. The fluid supply slots 214 typically have dimensions of about 6 to about 30 millimeters long and from about 0.25 to about 0.75 millimeters wide. Techniques used for forming the slots 214 may be selected from wet and dry etch techniques or mechanical techniques such as grit blast.

Once developed, the thick film layer 206 contains the fluid supply channels, such as supply channel 202 in flow communication with the slot 214 to provide fluid to fluid ejection chambers, such as ejection chamber 204. There is typically one ejection chamber 204 and one fluid supply channel 202 for each fluid ejection actuator 212.

Before or after developing the flow features in the thick film layer 206 a photoimageable nozzle plate layer 216 may be attached to the thick film layer 206. The photoimageable nozzle plate (PINP) material 216 may be applied to the thick film layer by a variety of techniques including, but not limited to, spin coating, blade coating, lamination and the like. A particularly suitable method for applying the nozzle plate to the thick film layer is by a dry film lamination technique that uses heat and pressure in the absence of an adhesive.

A suitable liquid photoresist composition that may be used to provide a photoimageable nozzle plate includes a difunctional epoxy resin, a multi-functional epoxy resin, and a phenoxy resin, wherein the difunctional epoxy resin contains two epoxy groups and the multi-functional epoxy resin contains more than two epoxy groups. The resin components are provided in a solvent for liquid application to a backing web. A particularly suitable formulation for the liquid photoresist composition is set forth in the following table.

TABLE 5

| Component | Weight Percent |
|---|---|
| Resin components | 41.6 |
| Solvent | 34.0 |
| Photoinitiator catalyst | 22.2 |
| Optional adhesion enhancing agent | 2.2 |

Figure 21:
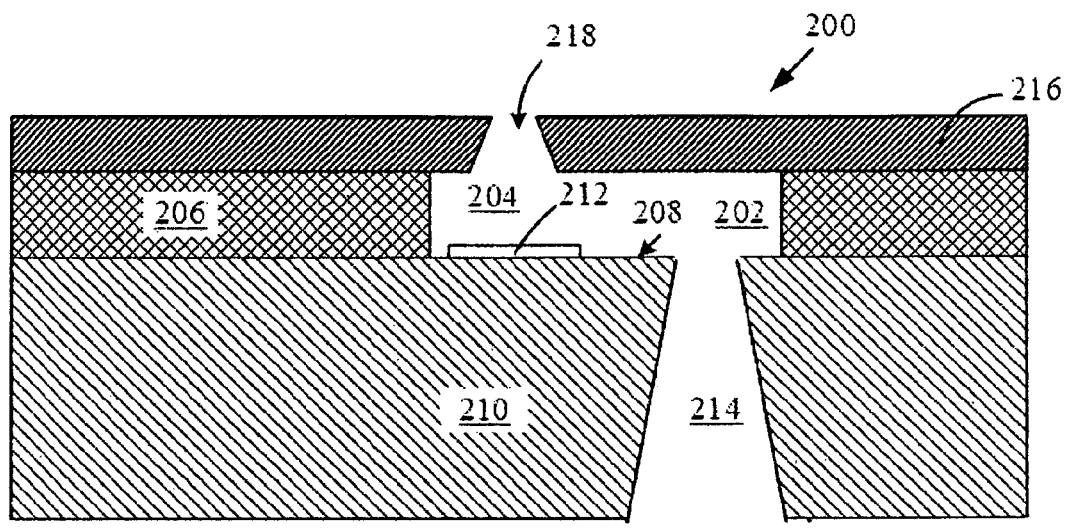

Nozzles are formed in the photoimageable layer 216 using a photo imaging technique similar to the technique described above with respect to imaging the thick film layer 206. After imaging the photoimageable layer 216, a suitable solvent is used to dissolve the non-imaged areas providing a nozzle plate 216 containing nozzles 218 as shown in FIG. 21.

Figure 22:
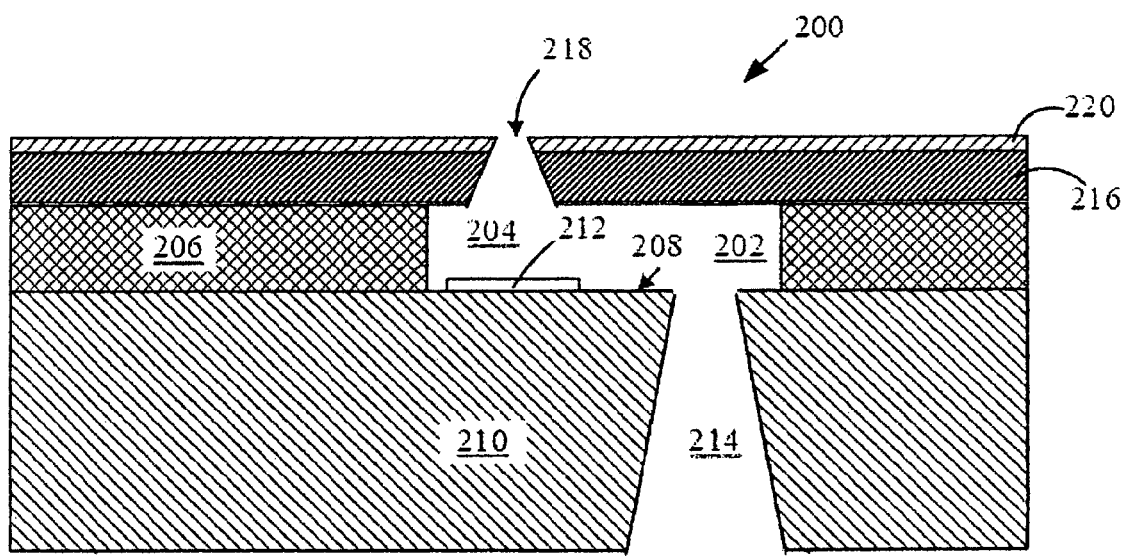

However, a difficulty with using a PINP nozzle plate 216 with a UV-curable fluid is that photoimageable nozzle plates tend to allow for some level of light transmission therethrough. The light transmission property of materials used to form the PINP nozzle plates 216 allow for fluid in the flow feature area including the ejector region, fluid chamber 204, fluid channel 202 and fluid supply slot 214 to be exposed to UV radiation which may crosslink the fluid while still inside of the ejection head thereby resulting in failure of the ejection head. In order to prevent UV light from transmitting through the PINP materials, a layer of UV opaque material 220 (FIG. 22) selected from ceramics such as $TiO_2$, $CeO_2$, $TiO_2$—$CeO_2$, and ZnO, etc. may be applied to the PINP material to shield the fluid from light. The UV opaque layer of material 220 may have a thickness ranging from about 1.5 microns to about 2.5 microns.

The thickness requirement of a typical UV opaque material 220 may be determined by use of the following form of the Beer-Lambert Law for the transmission of light.

$$T = \text{Transmitted Light}$$
$$= \frac{I}{I_0}$$
$$= \frac{\text{intensity of light exiting the material}}{\text{intensity of light incident on the material}}$$

$$T = \frac{I}{I_0} = \exp(-\alpha x)$$

$\alpha$ = absorption coefficient $x$ = pathlength

The absorption coefficient $\alpha$ may be represented by the following formula $$\alpha = \frac{4\pi\kappa}{\lambda}$$

$\kappa$ = the imaginary part of the refractive index $\lambda$ = wavelength(nm)

Values for ($\kappa$) may be found in the literature. For example $TiO_2$ has the following relationship between ($\kappa$) and ($\lambda$).

TABLE 6

| Wavelength $\lambda$ (nm) | Imaginary part of the TiO2 refractive index $\kappa$ = Im(np) |
|---|---|
| 288 | 2.40 |
| 294 | 2.47 |
| 307 | 1.72 |
| 318 | 1.92 |
| 360 | 0.16 |

Accordingly, a critical thickness of $TiO_2$ to block incident UV radiation may be given by the following equation:

$$x_{MIN} = \frac{\ln\left(\frac{I}{I_0}\right)}{\left(\frac{-4\pi\kappa}{\lambda}\right)}$$

Figure 23:
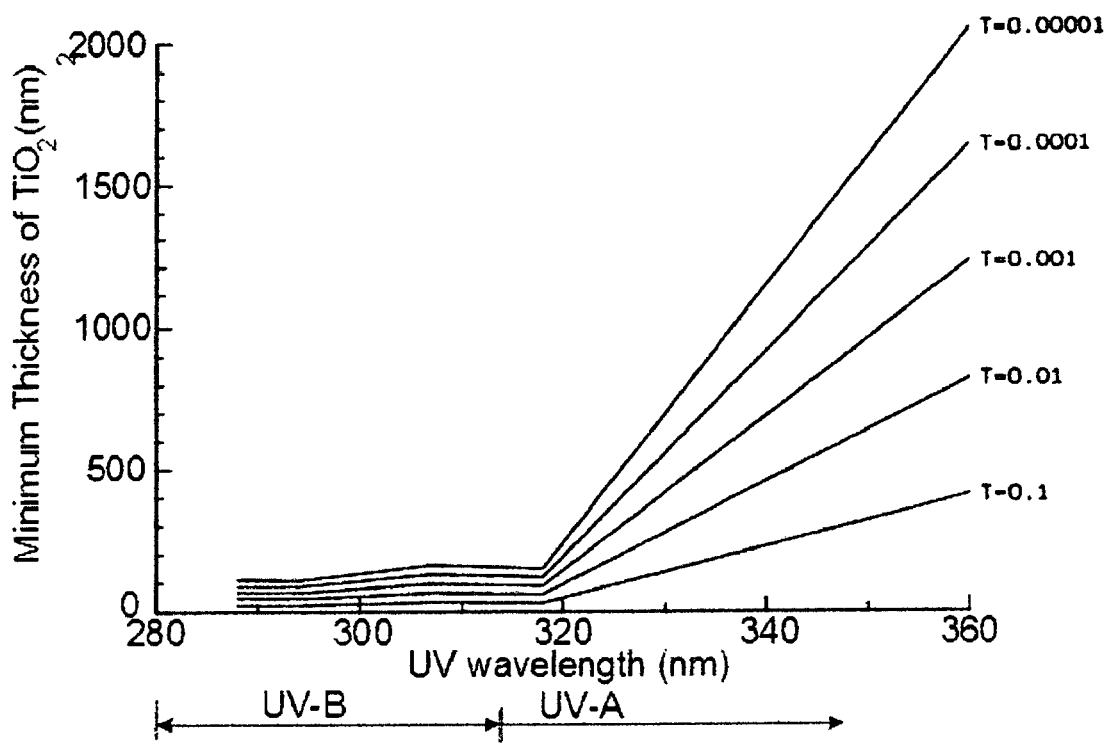
FIG. 23 is a graphical illustration of a minimum thickness of $TiO_2$ versus UV radiation wavelength for various transmission rates through the $TiO_2$.

Response curves for the foregoing equation are shown in FIG. 23. For example, in order to block 10 ppm of incident UV-A light wherein T is the transmission of light ($I/I_0$), the $TiO_2$ layer (220 in FIG. 22) may be about 2000 nanometers (2 microns) thick.

Another benefit of the use of oxides to shield the ejection head from UV radiation is that the oxides may also provide a hydrophilic nozzle plate surface which may reduce ejection head flooding caused by fluid accumulating on surfaces of the nozzle plate adjacent the nozzle holes 218.

In order to apply the UV absorbing layer, a variety of coating methods may be used. Coating methods may include but are not limited to roll coating, slot coating, blade coating, spray coating, and the like. Likewise, the photoimageable layer for the nozzle plate may be applied to a photoimaged thick film layer using a lamination technique.

Figure 24:
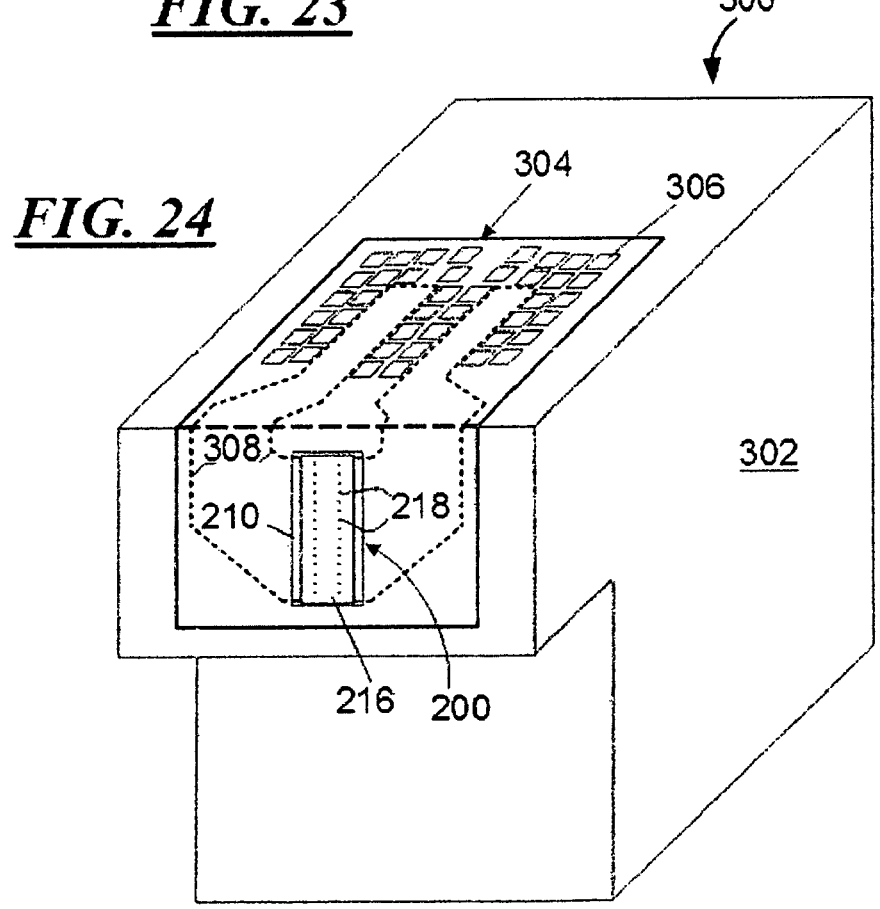
FIG. 24 is a perspective view, not to scale of a micro-fluid ejection head and fluid cartridge for ejecting a UV-curable fluid according to the disclosure.

The micro-fluid ejection head 200 may be attached in a well known manner to a chip pocket in a cartridge body to form micro-fluid ejection cartridge 300 as shown in FIG. 24. Fluid to be ejected is supplied to the micro-fluid ejection head 200 from a fluid reservoir 302 in the cartridge body 300 generally opposite the chip pocket. In an alternative, a remote fluid supply may be used to provide fluid to be ejected by the micro-fluid ejection head 200.

Since the UV-curable fluid is an aqueous-based fluid as with conventional aqueous-based inks, the cartridge body 302 of the cartridge 300 may be made of a metal or a polymeric material selected from the group consisting of amorphous thermoplastic polyetherimide available from G.E. Plastics of Huntersville, N.C. under the trade name ULTEM 1010, glass filled thermoplastic polyethylene terephthalate resin available from E. I. du Pont de Nemours and Company of Wilmington, Del. under the trade name RYNITE, syndiotactic polystyrene containing glass fiber available from Dow Chemical Company of Midland, Mich. under the trade name QUESTRA, polyphenylene oxide/high impact polystyrene resin blend available from G.E. Plastics under the trade names NORYL SE1 and polyamide/polyphenylene ether resin available from G.E. Plastics under the trade name NORYL GIX. A suitable polymeric material for making the cartridge body is NORYL SE1 polymer.

As shown in FIG. 24, a flexible circuit 304 may be attached to the cartridge 300 to provide electrical impulses from contacts 306 through electrical tracing 308 to the ejection head 200. One or more cartridges 300 containing the ejection head 200 may be used in a micro-fluid ejection device 100, such as an ink jet printer as shown in FIG. 15 to provide control and ejection of UV-curable fluid from the ejection head 200.

The ejection heads 200 described above may be operated to eject an aqueous-based UV-curable fluid to provide a relatively high resolution image on a substrate. The ejection actuators 212 for the ejection heads 200 may have a size ranging from about 600 μm² to about 1100 μm² and one or more protective layers having an overall thickness ranging from about 0.5 μm to about 1.5 μm. Accordingly, ejection of fluid from the ejection heads may have a power per unit volume of fluid ejected ranging from about 2 to about 3 Peta-Watts per cubic meter and an energy per unit volume of fluid ejected ranging from about 2.5 to about 4.0 Giga-Joules per cubic meter. The power per unit volume of fluid may be determined by the following formula:

$$P/V = \frac{i^2 R_{htr}}{A_{htr} \times h_R + h_{OC}}$$

and the energy per unit volume of fluid is given by the following formula:

$$E/V = \frac{\int_0^{tp} (i^2 R_{htr}) dt}{A \times (h_R + h_{OC})}$$

wherein P is the power in Peta-Watts, V is the droplet volume, i is the current, $R_{htr}$ is the heater resistance, $A_{htr}$ is the heater area, $h_R$ is the heater film thickness, $h_{oc}$ is the protective film thickness on the heater film, tp is the heater on pulse time, and dt is the increment of heater on pulse time.

A micro-fluid ejection device ejecting 16.5 picoliters of UV-curable fluid may have a pumping effectiveness of from about 3 to about 8 pL per micro-joule and provide a droplet having a jet velocity ranging from about 8 to about 10 meters per second.

Other embodiments of the present disclosure will be apparent to those skilled in the art from consideration of the specification and practice of the embodiments disclosed herein. As used throughout the specification and claims, "a" and/or "an" may refer to one or more than one. Unless otherwise indicated, all numbers expressing quantities of ingredients, properties such as molecular weight, percent, ratio, reaction conditions, and so forth used in the specification and claims are to be understood as being modified in all instances by the term "about." Accordingly, unless indicated to the contrary, the numerical parameters set forth in the specification and claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. It is intended that the specification and examples be considered as exemplary only, with a true scope and spirit of the invention being indicated by the following claims.

The patentees do not intend to dedicate any disclosed embodiments to the public, and to the extent any disclosed modifications or alterations may not literally fall within the scope of the claims, they are considered to be part hereof under the doctrine of equivalents.

What is claimed is:

1. An aqueous ultraviolet-curable fluid composition for use in a micro-fluid ejection device, comprising:
a mixture of polymerizable poly-functional compounds including
a first compound having a high viscosity range of greater than about 150 cps at 25° C.,
a second compound having a medium viscosity range of from about 40 to about 80 cps at 25° C., and
a third compound having a low viscosity range of less than about 4 cps at 25° C., wherein the mixture of polymerizable poly-functional compounds is approximately from about 15 to about 30% by weight of the ultraviolet-curable fluid;
a colorant being from about 2 to about 8% by weight of the ultraviolet-curable fluid for a pigment based colorant and from about 3 to about 6% by weight of the ultraviolet-curable fluid for a dye based colorant;
a photo-initiator being from about 0.1 to about 5% by weight of the ultraviolet-curable fluid, wherein the photo-initiator is substantially soluble in at least one of the polymerizable poly-functional compounds;
a humectant being from about 12 to about 25% by weight of the ultraviolet-curable fluid, wherein the humectant has a boiling point of greater than about 200° C. and a viscosity of less than about 13 cps; and
water being from about 40 to about 50% by weight of the UV curable fluid wherein the fluid composition is substantially devoid of volatile organic carrier fluids.

2. The aqueous ultraviolet-curable fluid composition of claim 1, wherein the mixture of polymerizable poly-functional compounds comprise:
trimethylolpropane triacrylate as the first compound having a functionality of three and a viscosity of 225 cps at 25° C.;
polyethylene glycol-400 diacrylate as the second compound having a functionality of two and a viscosity of 57 cps at 25° C.; and
N-methyl-2-pyrrolidone as the third compound.

3. The aqueous ultraviolet-curable composition of claim 2, wherein the mixture of polymerizable poly-functional compounds includes:
trimethylolpropane triacrylate in an amount of 4% by weight of ultraviolet-curable fluid;
polyethylene glycol-400 diacrylate in an amount of 8% by weight of ultraviolet-curable fluid; and
N-methyl-2-pyrrolidone in an amount of 10% by weight of ultraviolet-curable fluid.

4. The aqueous ultraviolet-curable fluid composition of claim 2, wherein the composition has a viscosity of 3.24 cps at 45° C.

5. The aqueous ultraviolet-curable fluid composition of claim 2, wherein the composition has a thermal diffusivity value of about 0.12 μm² per microsecond.

6. The aqueous ultraviolet-curable fluid composition of claim 2, wherein the composition has a superheat limit of about 292° C. at a heater interface.

7. The aqueous ultraviolet-curable fluid composition of claim 2, wherein the composition has a spread factor (D*/d) of about 1.9 on a non-porous substrate, wherein D* represents a spot diameter formed by a fluid droplet on the substrate and d represents a diameter of the fluid droplet prior to impact on the substrate.

8. The aqueous ultraviolet-curable fluid composition of claim 1, wherein the photo-initiator is substantially soluble in the first compound and present in an amount of about 4% by weight of ultraviolet-curable fluid.

9. The aqueous ultraviolet-curable fluid composition of claim 1, wherein the humectant comprises diethylene glycol monobutyl ether and is present in an amount of about 20% by weight of the ultraviolet-curable fluid.

10. The aqueous ultraviolet-curable fluid composition of claim 1, wherein the surfactant is present in an amount of about 1% by weight of the ultraviolet-curable fluid.

11. The aqueous ultraviolet-curable fluid composition of claim 1, wherein the colorant is a pigment based colorant and present in an amount of about 5% by weight of the ultraviolet-curable fluid.

12. An ultraviolet-curable ink composition comprising:
 a mixture of polymerizable poly-functional compounds including
  a first compound having a high viscosity range of greater than about 150 cps at 25° C.,
  a second compound having a medium viscosity range of from about 40 to about 80 cps at 25° C., and
  a third compound having a low viscosity range of less than about 4 cps at 25° C., wherein the mixture of polymerizable poly-functional compounds is approximately from about 15 to about 30% by weight of ultraviolet-curable fluid composition;
 a colorant being from about 2 to about 8% by weight of the ultraviolet-curable fluid for a pigment based colorant and from about 3 to about 6% by weight of the ultraviolet-curable fluid for a dye based colorant;
 a photo-initiator being from about 0.1 to about 5% by weight of the ultraviolet-curable fluid, wherein the photo-initiator is substantially soluble in at least one of the polymerizable poly-functional compounds;
 a humectant being from about 12 to about 25% by weight of the ultraviolet-curable fluid, wherein the humectant has a boiling point of greater than about 200° C. and a viscosity of less than about 13 cps; and
 a water being from about 40 to about 50% by weight of the UV curable fluid.

13. The ultraviolet-curable ink composition of claim 12, wherein the mixture of polymerizable poly-functional compounds includes:
 trimethylolpropane triacrylate as the first compound having a functionality of three and a viscosity of 225 cps at 25° C.;
 polyethylene glycol-400 diacrylate as the second compound having a functionality of two and a viscosity of 57 cps at 25° C.; and
 N-methyl-2-pyrrolidone as the third compound.

* * * * *